(12) United States Patent
Okamoto et al.

(10) Patent No.: US 7,973,335 B2
(45) Date of Patent: Jul. 5, 2011

(54) FIELD-EFFECT TRANSISTOR HAVING GROUP III NITRIDE ELECTRODE STRUCTURE

(75) Inventors: Yasuhiro Okamoto, Tokyo (JP); Hironobu Miyamoto, Tokyo (JP); Yuji Ando, Tokyo (JP); Tatsuo Nakayama, Tokyo (JP); Takashi Inoue, Tokyo (JP); Masaaki Kuzuhara, Tokyo (JP)

(73) Assignee: NEC Corporation, Tokyo (JP)

( * ) Notice: Subject to any disclaimer, the term of this patent is extended or adjusted under 35 U.S.C. 154(b) by 468 days.

(21) Appl. No.: 10/538,739

(22) PCT Filed: Dec. 15, 2003

(86) PCT No.: PCT/JP03/16034
§ 371 (c)(1),
(2), (4) Date: Nov. 9, 2005

(87) PCT Pub. No.: WO2004/055905
PCT Pub. Date: Jul. 1, 2004

(65) Prior Publication Data
US 2006/0102929 A1  May 18, 2006

(30) Foreign Application Priority Data
Dec. 16, 2002 (JP) .................................. 2002-364405

(51) Int. Cl.
*H01L 31/072* (2006.01)
(52) U.S. Cl. ................. 257/189; 257/183; 257/E29.127; 257/E29.253

(58) Field of Classification Search .................. 257/183, 257/189, E29.127, E29.253
See application file for complete search history.

(56) References Cited

U.S. PATENT DOCUMENTS

| | | | |
|---|---|---|---|
| 6,483,135 B1 * | 11/2002 | Mizuta et al. | 257/283 |
| 6,586,813 B2 | 7/2003 | Nagahara | |
| 2001/0015446 A1 * | 8/2001 | Inoue et al. | 257/192 |
| 2001/0017370 A1 * | 8/2001 | Sheppard et al. | 257/24 |
| 2002/0005528 A1 | 1/2002 | Nagahara | |
| 2002/0043697 A1 * | 4/2002 | Hirokawa et al. | 257/472 |
| 2003/0020092 A1 * | 1/2003 | Parikh et al. | 257/192 |
| 2003/0235974 A1 * | 12/2003 | Martinez et al. | 438/555 |

FOREIGN PATENT DOCUMENTS

| | | |
|---|---|---|
| JP | 02-072667 | 3/1990 |
| JP | 08-083813 | 3/1996 |
| JP | 08-222579 | 8/1996 |
| JP | 09-027505 | 1/1997 |
| JP | 09-307097 A | 11/1997 |

(Continued)

OTHER PUBLICATIONS

Ando et al., "A 110-W AlGaN/GaN Heterojunction FET on Thinned Sapphire Substrate," IEDM 01, 2001, pp. 381-384.
Li et al., "High breakdown voltage GaN HFET with field plate," Electronics Letters, Feb. 1, 2001, vol. 37, No. 3, pp. 196-197.

(Continued)

*Primary Examiner* — Wael M Fahmy
*Assistant Examiner* — Sarah K Salerno
(74) *Attorney, Agent, or Firm* — Foley & Lardner LLP

(57) ABSTRACT

A field plate portion (5) overhanging a drain side in a visored shape is formed in a gate electrode (2). A multilayered film including a SiN film (21) and a $SiO_2$ film (22) is formed beneath the field plate portion (5). The SiN film (21) is formed so that a surface of an AlGaN electron supply layer (13) is covered therewith.

12 Claims, 38 Drawing Sheets

FOREIGN PATENT DOCUMENTS

| | | | |
|---|---|---|---|
| JP | 09307097 A | * | 11/1997 |
| JP | 2000-100831 A | | 4/2000 |
| JP | 2000-323495 A | | 11/2000 |
| JP | 2000323495 A | * | 11/2000 |
| JP | 2000-353708 A | | 12/2000 |
| JP | 2001-189324 A | | 7/2001 |
| JP | 2001-230263 A | | 8/2001 |
| JP | 2002-100642 | | 4/2002 |
| JP | 2002-359256 A | | 12/2002 |
| JP | 2002-359256 A | | 12/2002 |

OTHER PUBLICATIONS

Mishra et al., "AlGaN/GaN HEMTs—An Overview of Device Operation and Applications," Proceedings of the IEEE, Jun. 2002, vol. 90, No. 6, pp. 1022-1031.

Tan et al., "The Effect of Dielectric Stress on the Electrical Characteristics of AlGaN/GaN Heterostructure Field-Effect Transistors (HFETs)," The $10^{th}$ IEEE International Symposium on Electron Devices for Microwave and Optelectronic Applications, Nov. 2002, pp. 130-135.

Zhang, N.Q. et al., "Effects of surface traps on breakdown voltage and switching speed of GaN power switching HEMTs," 2001 IEEE, pp. 25.5.1-25.5.4.

Shawn T. Bradley et al., "Influence of AlGaN Deep Level Defects on AlGaN/GaN 2-DEG Carrier Confinement," IEEE Transactions on Electron Devices, vol. 48:3, Mar. 2001, 7 pages.

J. Li et al, "High Breakdown Voltage GaN HFET With Field Plate," Electronic Letters, Feb. 1, 2001, vol. 37:3, pp. 196-197.

* cited by examiner

FIELD-EFFECT TRANSISTOR HAVING GROUP III NITRIDE ELECTRODE STRUCTURE

This application is a National Stage application of PCT/JP2003/016034, filed Dec. 15, 2003, which claims priority from Japanese patent application JP 2002-364405, filed Dec. 16, 2002. The entire contents of each of the aforementioned applications are incorporated herein by reference.

FIELD OF THE INVENTION

The present invention relates to a field-effect transistor in which a Group III nitride semiconductor is used.

DESCRIPTION OF THE RELATED ART

Group III nitride semiconductors including GaN have a large band gap, a high dielectric breakdown electric field, and high electron saturation drift velocity. Further, because two-dimensional carrier gas can be utilized by a heterojunction, the Group III nitride semiconductors are expected as a material for realizing an electronic element which is excellent for high-temperature operation, high-speed switching operation, large-power operation, and the like.

In the transistor in which the Group III nitride semiconductor is used, the large amount of negative charge is generated in the substrate surface, which largely affects transistor performance. This respect will be described below.

When AlGaN is grown on undoped GaN, a positive fixed charge is generated in a hetero-interface by actions of both spontaneous polarization and piezo polarization. At this point, a negative polarization charge is generated in the AlGaN surface. Polarization charge density is changed by AlGaN composition. Extremely large sheet electron density having an order of $1 \times 10^{13}$ cm$^2$ is generated in an AlGaN/GaN heterostructure. This phenomenon is explained in detail, e.g., in Non-Patent Reference 1. When ohmic electrodes are formed in the heterostructure to apply the electric field between the electrodes, current is passed based on charge transport of the high electron density having the order of $1 \times 10^{13}$/cm$^2$. Thus, unlike a GaAs semiconductor FET driven by a carrier generated by impurity doping, the Group III nitride semiconductor element is operated by the high-density carrier generated by the actions of both the spontaneous polarization and the piezo polarization.

In the Group III nitride semiconductor transistor operated by the above-described mechanism, it is known that while the large amount of charge is generated in a channel layer by the piezo polarization and the like, the negative charge is generated in the semiconductor layer surface of AlGaN and the like (Non-Patent Reference 2). The negative charge acts directly on drain current to strongly affect the element performance. Specifically, when the large negative charge is generated in the surface, the maximum drain current during alternating current operation is deteriorated compared with direct current operation. This phenomenon is unique to the elements in which the Group III nitride semiconductor is used, and the phenomenon does not become obvious in the GaAs semiconductor elements. This is because the extremely small amount of the polarization charge is generated in the AlGaAs/GaAs heterojunction.

In order to solve the above problem, conventionally a surface protection film made of SiN is formed. However, in a structure in which SiN is not provided, because the sufficient current is not obtained in applying high voltage, it is difficult to obtain a merit that the GaN semiconductor material is used.

In consideration of such situations, there is a common perception that the provision of the SiN film on the surface is required in the field of the Group III nitride semiconductor FET, and it becomes technical common sense. An example of the conventional transistors will be described.

FIG. 21 is a sectional structural drawing of a heterojunction field-effect transistor (hereinafter referred to as HJFET) by the conventional art. For example, the conventional HJFET is reported in Non-Patent Reference 3. An AlN buffer layer 111, a GaN channel layer 112, and an AlGaN electron supply layer 113 are sequentially laminated on a sapphire substrate 109 in the conventional HJFET. A source electrode 101 and a drain electrode 103 are formed on the multilayered film, and these electrodes are in ohmic contact with the AlGaN electron supply layer 113. A gate electrode 102 is formed between the source electrode 101 and the drain electrode 103, and the gate electrode 102 is in contact with the AlGaN electron supply layer 113 in a Schottky contact manner. A SiN film 121 is formed as the surface protection film in the uppermost layer.

In a specific application of the Group III nitride semiconductor FET, it is respected that breakdown voltage is increased while gain is maintained. In the field of the GaAs semiconductors, a method in which a visor-shaped field plate is provided on a drain side of the gate electrode is known as the method of improving the breakdown voltage. This technique is described in Patent Reference 1 by the inventor. According to the Patent Reference 1, electric field concentration is relaxed in a drain side end portion of the gate electrode to improve the element performance by providing the field plate.

Non-Patent Reference 3 describes HJFET, in which the structure with the field plate provided and the GaN-FET structure with SiN provided as the protection film are combined.

The structure, in which the visor-shaped field plate is provided on the drain side of the gate electrode and the SiN film is arranged below the field plate, is described in Non-Patent Reference 3. FIG. 22 shows a schematic structure of HJFET described in Non-Patent Reference 3. HJFET is formed on a SiC substrate 110. The buffer layer 111 including a semiconductor layer is formed on the SiC substrate 110. A GaN channel layer 112 is formed on the buffer layer 111. The AlGaN electron supply layer 113 is formed on the channel layer. The source electrode 101 and drain electrode 103, in which the ohmic contact is secured, are located on the electron supply layer. The gate electrode 102 in which the Schottky contact is secured is located on between the source electrode 101 and the drain electrode 103. The gate electrode 102 has a field plate portion 105 overhanging the drain side in a visored shape. The surface of the AlGaN electron supply layer 113 is covered with the SiN film 121, and the SiN film 121 is arranged immediately below the field plate portion 105. According to Non-Patent Reference 3, the breakdown voltage is improved by adopting the above structure.

Non-Patent Reference 1: U. K. Mishra, P. Parikh, and Y.-F. Wu, "AlGaN/GaN HEMTs—An overview of device operation and applications," Proc. IEEE, vol. 90, No. 6, pp. 1022-1031, 2002.

Non-Patent Reference 2: Y. Ando, International Electron Device Meeting Digest (IEDM01-381 to 384), 2001.

Non-Patent Reference 3: Li et al., Electronics Letters vol. 37 p. 196-197, 2001

Patent Reference 1: Japanese Patent Application Laid-Open No. 2000-100831

SUMMARY OF THE INVENTION

However, in the case where the structure described in Non-Patent Reference 3 is adopted, as a result of study of the inventor, it is found that the new problem which is not conventionally known is generated.

In the case where the transistor is formed by the Group III nitride semiconductor, from the viewpoint of making full use of material properties of the Group III nitride semiconductor, the following properties are compatible with one another.
(i) Decrease in collapse,
(ii) Improvement of gate breakdown voltage,
(iii) Reliability improvement by suppressing aged deterioration in quality of an insulating film immediately below the field plate, and
(iv) Improvement of a high-frequency gain by decrease in capacity.

At this point, the term of collapse means the phenomenon in which the negative charge is accumulated in the surface by surface trap response and the maximum drain current is suppressed when HJFET is operated in a large signal. When the collapse becomes remarkable, the drain current is suppressed in the large signal operation, which results in a decrease in saturation output.

In the case where the structure described in Non-Patent Reference 3 is adopted, SiN which is utilized as the film for eliminating the influence of the surface charge occupies an area immediately below the field plate, which causes the compatibility with respect to (i) to (iv) to become difficult. This respect will be sequentially described below.

As described above, in AlGaN/GaN HJFET and the like, the structure in which the SiN protection film is formed on the uppermost layer of the semiconductor layer is usually adopted in order to suppress the decrease in drain current. However, when the SiN film is provided, gate breakdown voltage is decreased while the collapse is improved. Namely, there is a trade-off between the amount of collapse and the gate breakdown voltage, and the control becomes extremely difficult. FIG. 23 shows the evaluation result of the relationship among a thickness of the surface protection film SiN, the amount of collapse, and the gate breakdown voltage when HJFET having the structure of FIG. 21 in which the field plate is not provided.

When the SiN film is formed on the surface of the element in which the collapse is remarkably generated, the amount of collapse can be decreased. Referring to FIG. 23, the amount of collapse is not lower than 60% of the current change by collapse when the SiN film does not exist (film thickness of 0 nm). When the SiN film thickness is set at 100 nm, the amount of collapse can be suppressed to values not more than 10% of the current change by collapse. Thus, in order to sufficiently suppress the collapse, it is necessary that the thickness of the SiN film is set at a certain degree. However, when the SiN film is thickened, the surface negative charge is eliminated and the electric field concentration becomes remarkable between the gate and the drain, which results in the decrease in gate breakdown voltage. Namely, there is the trade-off between the collapse and the gate breakdown voltage.

In addition, when the SiN film is sufficiently thickened in order to sufficiently decrease the collapse, reliability is decreased by aged deterioration in film quality of the insulating film located immediately below the field plate. Namely, there is also the trade-off between the collapse and the reliability.

Thus, the plural trade-offs exist in the GaN HJFETs in which the SiN film is used as the protection film, and each balance of the trade-offs is determined by the difference in SiN film thickness. The trade-offs are the unique phenomenon to the GaN elements.

In the case where a $SiO_2$ film is used as the protection film instead of the SiN film, the relationship between the collapse and the gate breakdown voltage is shown in FIG. 38. Although the film thickness dependence is absent, as with the use of the SiN film, it is difficult to maintain the compatibility between the collapse and the gate breakdown voltage.

There is still the trade-off in the structure in which the field plate described in Non-Patent Reference 3 is provided. Namely, when the structure described in Non-Patent Reference 3 is adopted, the effect is obtained to a certain level with respect to the improvement of the collapse in (i) to (iv). On the other hand, because the gate breakdown voltage is decreased, it is difficult to effectively improve the balance of the trade-off between the collapse and the gate breakdown voltage.

Further, it is further difficult to eliminate the trade-off between the collapse or the gain and the reliability. In order to sufficiently decrease the collapse while the decrease in gain is suppressed, it is necessary that the SiN film located immediately below the field plate is thickened to a certain degree. However, at this point, the reliability is remarkably decreased by the aged deterioration in film quality of the insulating film immediately below the field plate.

As described above, even if the field plate is provided in the GaN HJFETs in which the SiN film is used as the protection film, it is difficult to effectively solve the problem of the trade-off which is unique to the Group III nitride semiconductor elements.

In the case where the SiN film is arranged in the area immediately below the field plate like the transistor described in Non-Patent Reference 3, in some cases, the film quality of the SiN film is deteriorated in applying the high electric field. When the SiN film is deposited on the Group III nitride semiconductor layer, due to the material characteristics of the SiN film, large internal stress is generated in the SiN film. The internal stress causes the remarkable generation of the aged deterioration in film quality in applying the electric field. In the extreme case, leak is generated in the area below the field plate.

In view of the foregoing, an object of the invention is to provide a transistor which is excellent for the balance between the collapse and the gate breakdown voltage. Another object of the invention is to provide a transistor which is excellent for the reliability and high-frequency properties in addition to the performance balance between the collapse and the gate breakdown voltage.

The negative polarization charge generated in the AlGaN surface largely affects the FET characteristics depending on electric properties of the protection film (passivation film) deposited on AlGaN. Usually, when the large negative fixed charge exists on the surface, although the large gate breakdown voltage is obtained, the maximum drain current during the alternating current operation tends to be deteriorated compared with the direct current operation. On the other hand, when the amount of negative charge is small in the surface, although the gate breakdown voltage is small, the deterioration in maximum drain current is also small during the alternating current operation. The operation of FET is usually dominated by the trade-off relationship. In the AlGaN/GaN heterostructure, since the negative charge having the order of $1 \times 10^{13}/cm^2$ is generated in the surface, the trade-off relationship appears extremely remarkably depending on the quality of the surface passivation. The breakdown voltage value is frequently changed to at least one digit larger or smaller value due to a difference in a state of the surface passivation. Such large changes do not appear in GaAs FETs. In other words, GaN FETs are the device which is very sensitive to the surface state. In order to stably obtain the high performance with high yield with respect to the electric properties of GaN FETs, it is necessary to pay utmost attention to the control of the surface passivation film.

From the above points of view, the inventor performed the study and found that the performance balance in the trade-off can effectively be improved by forming the gate electrode structure including the field plate and the specific layer structure immediately below the field plate to exert synergistic action between the gate electrode structure and the specific layer structure. Further, when the area immediately below the field plate is formed in the specific layer structure, the inventor found that the field plate has the function, which is not conventionally known, of effectively suppressing variations in performance caused by a fluctuation in surface state. The invention is made based on the new findings.

Then, the constitution of the invention will be described.

According to the invention, there is provided a field-effect transistor comprising a Group III nitride semiconductor layer structure including a heterojunction, a source electrode and a drain electrode formed on the semiconductor layer structure while being separated from each other, a gate electrode arranged between said source electrode and said drain electrode, and an insulating film formed on said Group III nitride semiconductor layer, wherein, said gate electrode has a field plate portion formed on said insulating film while said field plate portion overhanging said drain electrode side in a visored shape, and said insulating film is a multilayered film including a first insulating film and a second insulating film, said first insulating film being made of a compound containing silicon and nitrogen as constituent elements, said second insulating film having a dielectric constant lower than that of said first insulating film.

The invention has the structure in which the multilayered film having the above configuration is formed between the field plate portion and the surface of the semiconductor layer structure while the field plate portion is provided, which generates synergistic action resulting in remarkable improvement of a balance between the collapse and the gate breakdown voltage. Further, even if a surface state is fluctuated by variations in manufacturing process, good performance can stably be realized.

In the invention, while the first insulating film is provided in order to decrease an influence of the surface negative charge, the second insulating film is provided in order to decrease the capacity immediately below the field plate portion. Namely, while the influence of the surface negative charge is decreased by the action of the first insulating film, the electric field immediately below the field plate portion is decreased by the second insulating film having the dielectric constant lower than that of the first insulating film. As a result, the aged deterioration in quality of the insulating film and the increase in capacity can effectively be suppressed in an area below the field plate portion, and the transistor which is excellent for the reliability and high-frequency gain can be obtained.

In the first insulating film, it is possible that the second insulating film is laminated on said first insulating film. Therefore, the collapse is remarkably improved. In the invention, the thickness of the first insulating film is not more than 150 nm, and preferably the thickness of the first insulating film is not more than 100 nm. Therefore, the capacity below the field plate portion can securely be decreased, and the high-frequency gain can be improved. In the invention, it is possible that the first insulating film is formed while being in contact with the surface of the semiconductor layer structure. Therefore, the collapse is improved more remarkably.

In the invention, it is also possible that a dielectric constant of said second insulating film may be not more than 3.5. Therefore, the capacity below the field plate portion can be decreased and the gain can be improved. In the invention, it is also possible that the insulating film formed by a multilayered film including the first insulating film and the second insulating film is separated from the gate electrode and the second insulating film may be provided between the insulating film and the gate electrode. Further, it is also possible that said second insulating film provided between said insulating film and said gate electrode is positioned below said field plate portion and said insulating film formed by the multilayered film including said first insulating film and said second insulating film may be positioned between a drain-side end portion of said field plate portion and said drain electrode.

In the transistor having the above structure, it is also possible to further include a third insulating film on said second insulating film, the third insulating film being made of a compound containing silicon and nitrogen as the constituent elements. The advantages such that a resist is stably formed in the process of manufacturing the element are obtained by forming the uppermost layer of the insulating film with the compound containing silicon and nitrogen as the constituent elements. As a result, yield can be improved in manufacturing the transistor in which the performance is improved in the above-described manner.

Further, according to the invention, there is provided a field-effect transistor comprising a Group III nitride semiconductor layer structure including a heterojunction, a source electrode and a drain electrode formed on the semiconductor layer structure while being separated from each other, a gate electrode arranged between said source electrode and said drain electrode, and an insulating film formed on said Group III nitride semiconductor layer, wherein said gate electrode has a field plate portion formed on said insulating film while said field plate portion overhanging said drain electrode side in a visored shape, and said insulating film is made of a compound containing silicon, nitrogen, and oxygen as constituent elements.

The invention has the structure in which the insulating film having the above configuration is formed between the field plate portion and the surface of the semiconductor layer structure while the field plate portion is provided. The material of the insulating film includes oxygen as the constituent element in addition to silicon and nitrogen, so that internal stress is remarkably decreased in the film when compared with SiN. Accordingly, while the relatively good collapse and gate breakdown voltage are realized, the deterioration in quality of the insulating film located in the area immediately below the field plate portion can effectively be suppressed. Because the dielectric constant is lower than that of SiN, the capacity generated in the area below the field plate portion can be decreased. Thus, according to the invention, the transistor which is excellent for the reliability and high-frequency gain can be obtained.

Further, according to the invention, there is provided a field-effect transistor comprising a Group III nitride semiconductor layer structure including a heterojunction, a source electrode and a drain electrode formed on the semiconductor layer structure while being separated from each other, a gate electrode arranged between said source electrode and said drain electrode, and an insulating film formed on said Group III nitride semiconductor layer, wherein, said gate electrode has a field plate portion formed on said insulating film while said field plate portion overhanging said drain electrode side in a visored shape, and said insulating film has dielectric constants not more than 3.5.

The invention has the structure in which the low-dielectric-constant film having the above configuration is formed between the field plate portion and the surface of the semiconductor layer structure while the field plate portion is provided. The low-dielectric-constant film is formed in the area immediately below the field plate portion, which allows the high voltage to be avoided from applying to the insulating film located in the area. Therefore, the aged deterioration in quality of the insulating film immediately below the field plate portion can effectively suppressed to remarkably improve the reliability of the element. Further, the capacity formed by the field plate portion, the semiconductor layer structure, and the insulating film therebetween can be decreased by utilizing the low-dielectric-constant film, so that the high-frequency gain can also be improved. As a result, according to the invention, the transistor which is particularly excellent for the gate breakdown voltage and performance balance between the reliability and the high-frequency gain can be obtained. In the insulating film having the dielectric constants not more than 3.5, it is possible that the insulating film is formed by either a single-layer film or a multilayered film as long as an average value of the dielectric constants is not more than 3.5.

Further, according to the invention, there is provided a field-effect transistor comprising a Group III nitride semiconductor layer structure including a heterojunction, a source electrode and a drain electrode formed on the semiconductor layer structure while being separated from each other, a gate electrode arranged between said source electrode and said drain electrode, and an insulating film formed on said Group III nitride semiconductor layer, wherein, said gate electrode has a field plate portion formed on said insulating film while said field plate portion overhanging said drain electrode side in a visored shape, and said gate electrode side of said insulating film is made of an insulating material having dielectric constants not more than 4 and said drain electrode side of said insulating film is made of an insulating material containing silicon and nitrogen as constituent elements.

According to the invention, the insulating film having the relatively low dielectric constant is provided immediately below the field plate portion, so that the capacity formed by the field plate portion, the semiconductor layer structure, and the insulating film therebetween can be decreased. As a result, the transistor which is excellent for the gate breakdown voltage and performance balance between the reliability and the high-frequency gain can be obtained. The compound, such as SiN, containing silicon, nitrogen, and oxygen as the constituent elements is formed in the area between the gate and drain where the field plate portion is not formed, so that the decrease in performance caused by the surface negative charge can be reduced. In the insulating film having the dielectric constants not more than 4, it is possible that the insulating film is formed by either the single-layer film or the multilayered film as long as an average value of the dielectric constants is not more than 4. In the invention, it is also possible that the drain electrode side of the insulating film may be made of the insulating material, such as SiON, containing silicon, nitrogen, and oxygen as the constituent elements. Therefore, the gate breakdown voltage and the performance balance between the reliability and the high-frequency gain can further be improved.

Further, according to the invention, there is provided a field-effect transistor comprising a Group III nitride semiconductor layer structure including a heterojunction, a source electrode and a drain electrode formed on the semiconductor layer structure while being separated from each other, a gate electrode arranged between said source electrode and said drain electrode, and an insulating film formed on said Group III nitride semiconductor layer, wherein, said gate electrode has a field plate portion formed on said insulating film while said field plate portion overhanging said drain electrode side in a visored shape, and said drain electrode side is lower than said gate electrode side in a dielectric constant of a capacity formed by said field plate portion, said Group III nitride semiconductor layer, and said insulating film sandwiched therebetween.

According to the invention, a degree of the electric field relaxation becomes stepwise in the area below the field plate portion, so that the gate breakdown voltage can further effectively be improved.

In the invention, it is possible that a part of said insulating film is a multilayered film including a first insulating film and a second insulating film, said first insulating film being made of a compound containing silicon and nitrogen as constituent elements, said second insulating film having a dielectric constant lower than that of said first insulating film, and said gate electrode side is formed by a single-layer film of the first insulating film and said drain electrode side is formed by the multilayered film including said first insulating film and said second insulating film in said insulating film between said field plate portion and a surface of said semiconductor layer structure. Therefore, the transistor in which the manufacturing stability is excellent and the gate breakdown voltage is remarkably improved can be obtained.

Thus, the structures of the transistor according to the invention have been described. Further, in the structures, it is also possible that the following structures may be combined.

It is possible that said semiconductor layer structure includes a channel layer made of $In_xGa_{1-x}N$ ($0 \leq x-1$) and an electron supply layer made of $Al_yGa_{1-y}N$ ($0 < y \leq 1$). The lamination order of the channel layer and the electron supply layer are arbitrarily determined. In the semiconductor layer structure, it is possible that an intermediate layer and a cap layer may be provided as appropriate.

It is also possible to form a structure in which contact layers are arranged between said source electrode and a surface of said semiconductor layer structure and between said drain electrode and a surface of said semiconductor layer structure, respectively. The structure including the contact layer is referred to as a wide recess structure. In the case where the wide recess structure is adopted, the electric field concentration can further effectively be dispersed and relaxed in the drain side end portion of the gate electrode by the synergistic action between the field plate portion and the insulating film structure immediately below the field plate portion. In the recess structure, it is also possible to form a multi-step recess. In this case, it is possible that the field plate portion may extend to an upper portion of the contact layer. Therefore, the electric field concentration can be relaxed on the drain side. In the case where the field plate portion extends, the electric field concentration becomes the problem in the drain electrode end portion due to overlap between the field plate portion and the drain electrode. However, the presence of the contact layer reduces the problem. When the contact layer is formed by an undoped AlGaN layer, i.e., the AlGaN layer in which the intentional doping is not performed, the electric field concentration can remarkably be reduced in the drain electrode end portion.

Further, it is also possible that the semiconductor layer structure has a structure in which the channel layer made of $In_xGa_{1-x}N$ ($0 \leq x \leq 1$), the electron supply layer made of $Al_yGa_{1-y}N$ ($0 < y \leq 1$), and a cap layer made of GaN are sequentially laminated. Therefore, the effective Schottky height can be increased to realize the higher gate breakdown voltage. Namely, the further excellent gate breakdown voltage can be obtained by the synergistic action among the field plate portion, the multilayered film immediately below the field plate portion, and the GaN cap layer according to the example of the invention.

It is also possible that a distance between the gate electrode and the drain electrode is formed longer than a distance between the gate electrode and the source electrode. It is also referred to as off-set structure, which effectively disperses and relaxes the electric field concentration in the drain side end portion of the gate electrode. Further, in the production, there is the advantage that the field plate portion is easy to form.

As described above, in the field-effect transistor of the invention, the suppression of the collapse and the higher gate breakdown voltage can simultaneously be realized. Accordingly, the output properties can be largely improved during the large signal operation with the high voltage.

BRIEF DESCRIPTION OF THE DRAWINGS

The above and other objects, features, and advantages will become more apparent from the following preferred embodiments and accompanying drawings therewith.

DETAILED DESCRIPTION OF THE INVENTION

Embodiments of the invention will be described below by examples. In the following examples, a c-surface SiC is used as a growth substrate of the Group III nitride semiconductor layer.

Example 1

Figure 1:
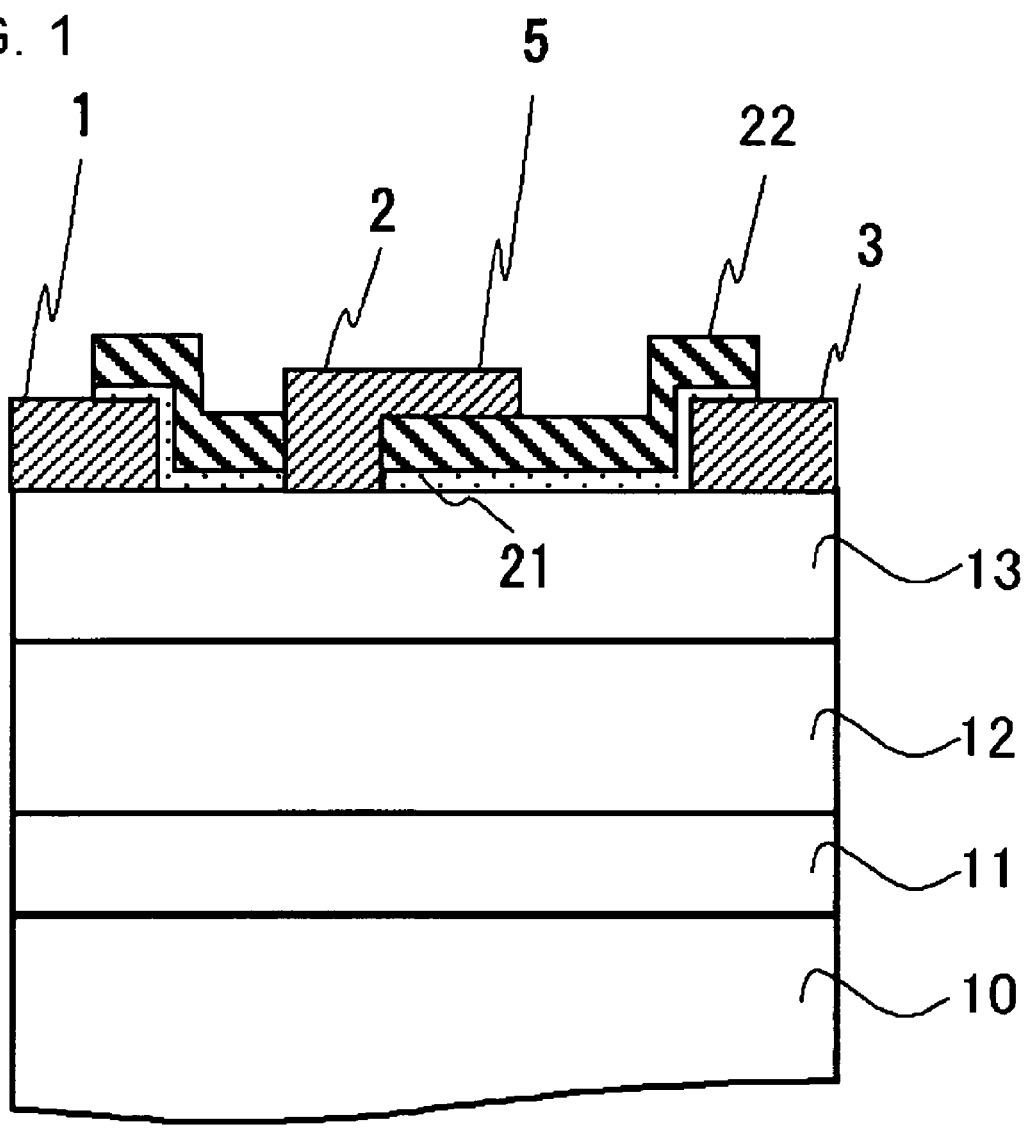
FIG. 1 is a view showing a transistor structure according to an example.

FIG. 1 shows a sectional structure of HJFET in Example 1. HJFET is formed on a substrate 10 made of a material such as SiC. A buffer layer 11 including a semiconductor layer is formed on the substrate 10. A GaN channel layer 12 (abbreviated as "GaN channel 12" in FIG. 1, hereinafter referred to as "GaN channel 12" in the following drawings) is formed on the buffer layer 11. An AlGaN electron supply layer 13 is formed on the GaN channel layer 12. A source electrode 1 and a drain electrode 3, in which ohmic contact is secured, are formed on the electron supply layer. A gate electrode 2, in which Schottky contact is secured, is provided between the source electrode 1 and the drain electrode 3. The gate electrode 2 has a field plate portion 5 overhanging the drain side in a visored shape. A surface of the electron supply layer 13 is covered with a SiN film 21, and a $SiO_2$ film 22 is further provided on the SiN film 21. The SiN film 21 and the $SiO_2$ film 22 are provided immediately below the field plate portion 5.

Figure 28A:
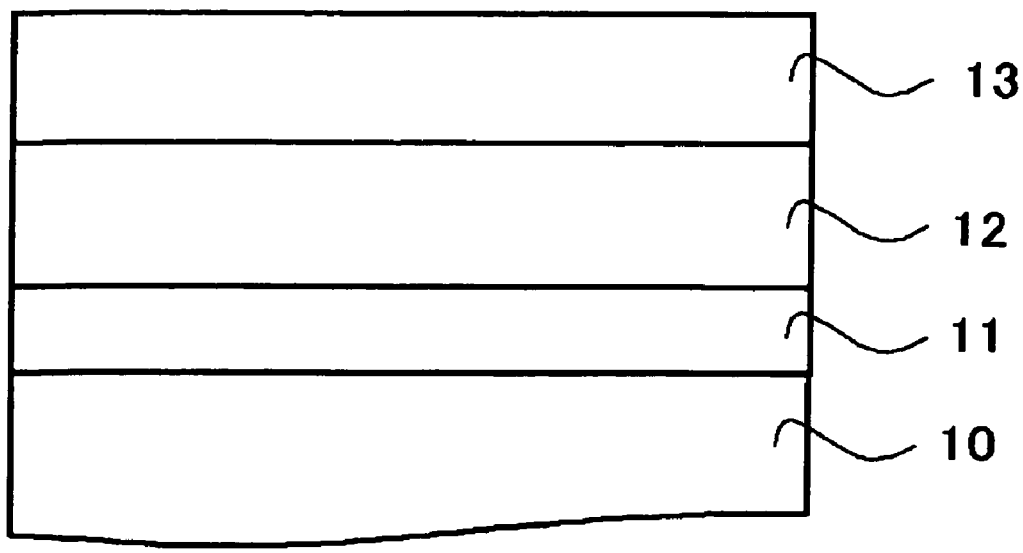
FIGS. 28A and 28B are views showing a transistor manufacturing method according to an example.

Referring to FIGS. 28A through 30B, a method of manufacturing HJFET according to Example 1 will be described below. At first, the semiconductor is grown on the substrate 10 made of SiC, e.g., by a molecular beam epitaxy (MBE) growth method. Similarly, the buffer layer 11 (film thickness of 20 nm) made of undoped AlN, the channel layer 12 (film thickness of 2 μm) made of undoped GaN, and the AlGaN electron supply layer 13 (film thickness of 25 nm) made of undoped $Al_{0.2}Ga_{0.8}N$ are laminated in the order from the substrate side, which obtains the semiconductor layer structure (FIG. 28A).

Figure 28B:
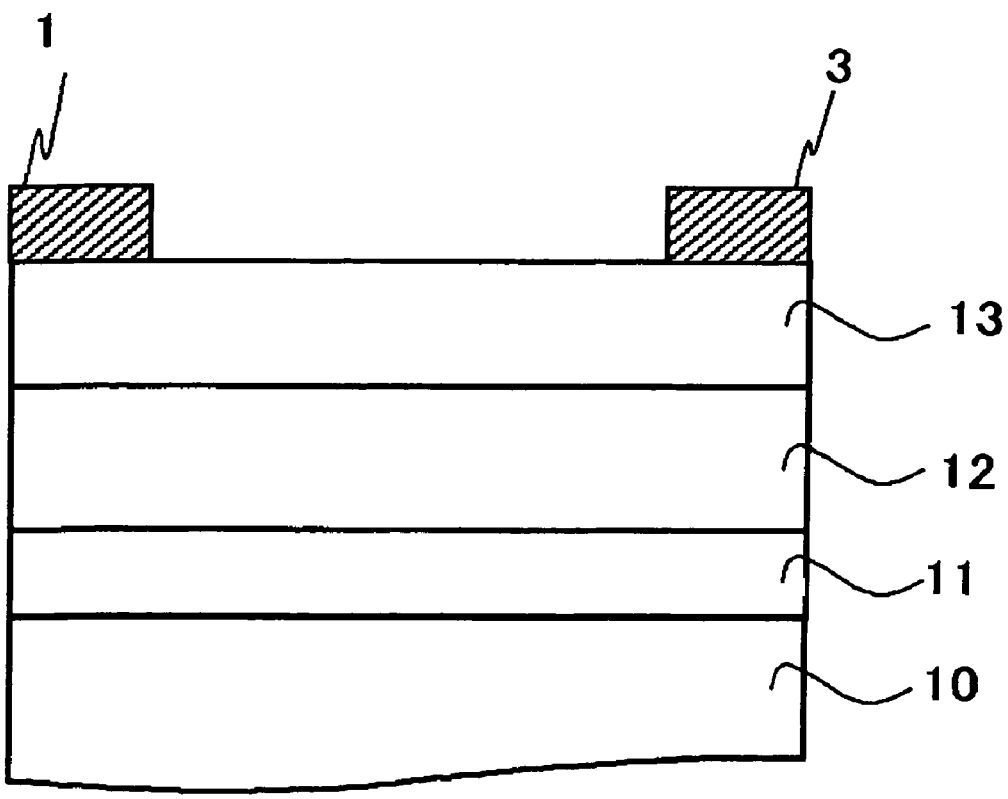
Figure 29A:
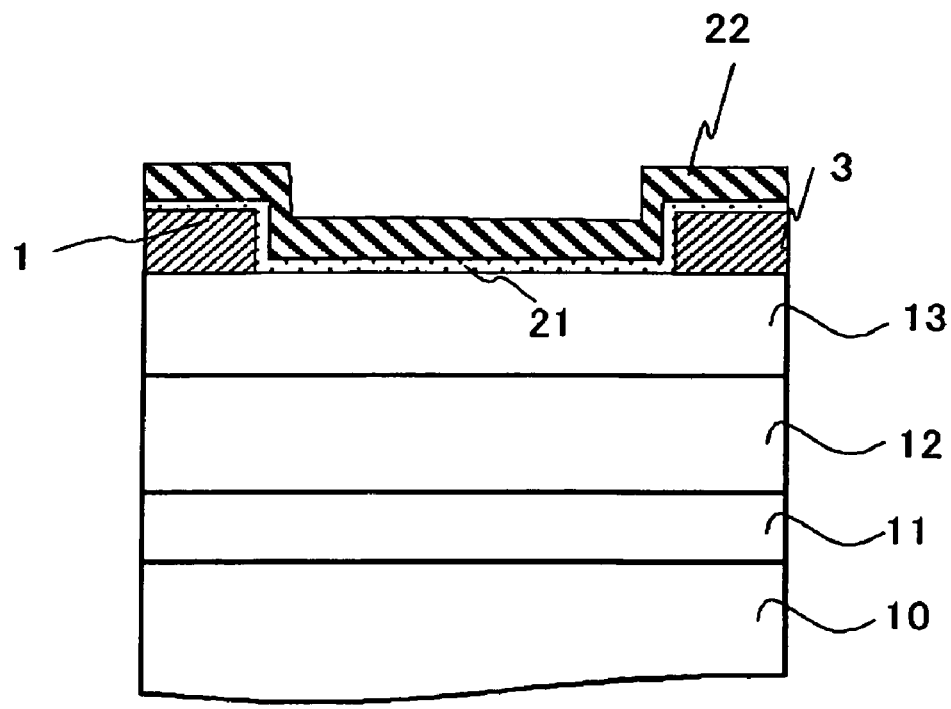
FIGS. 29A and 29B are views showing a transistor manufacturing method according to an example.
Figure 29B:
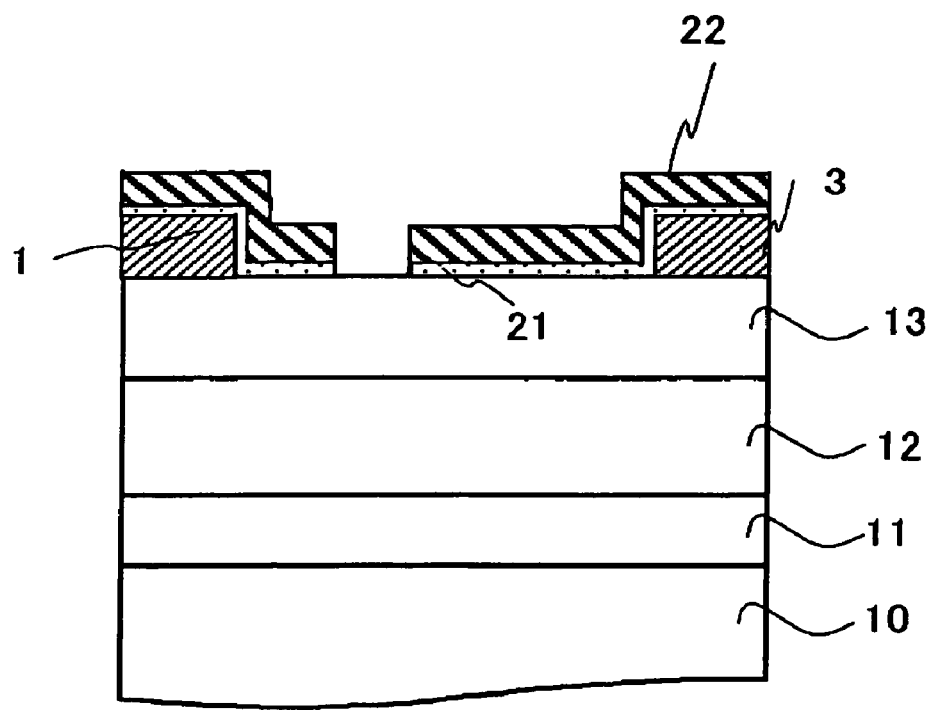
Figure 30A:
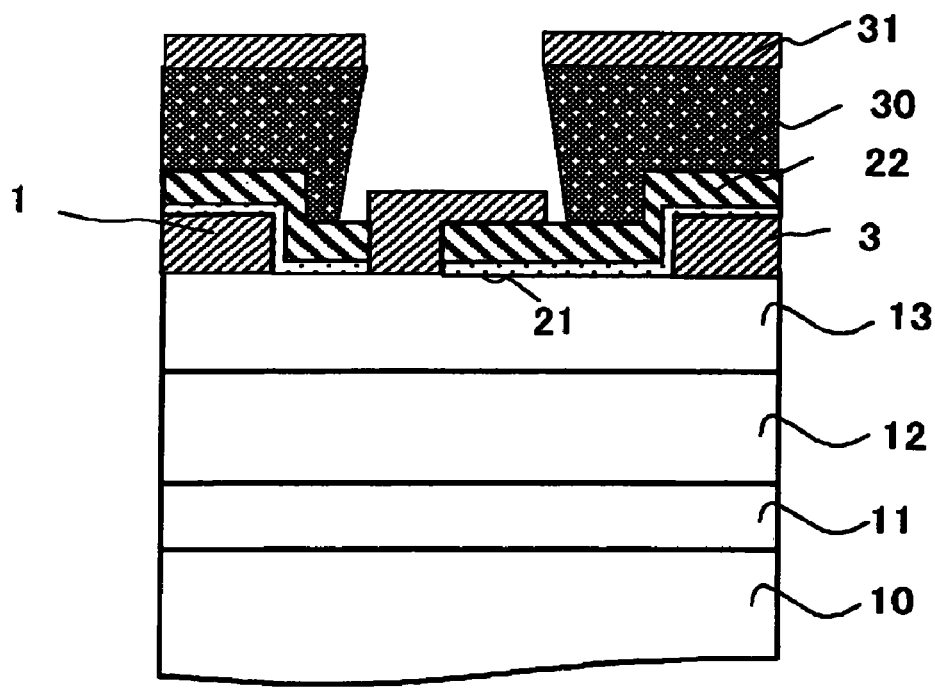
FIGS. 30A and 30B are views showing a transistor manufacturing method according to an example.
Figure 30B:
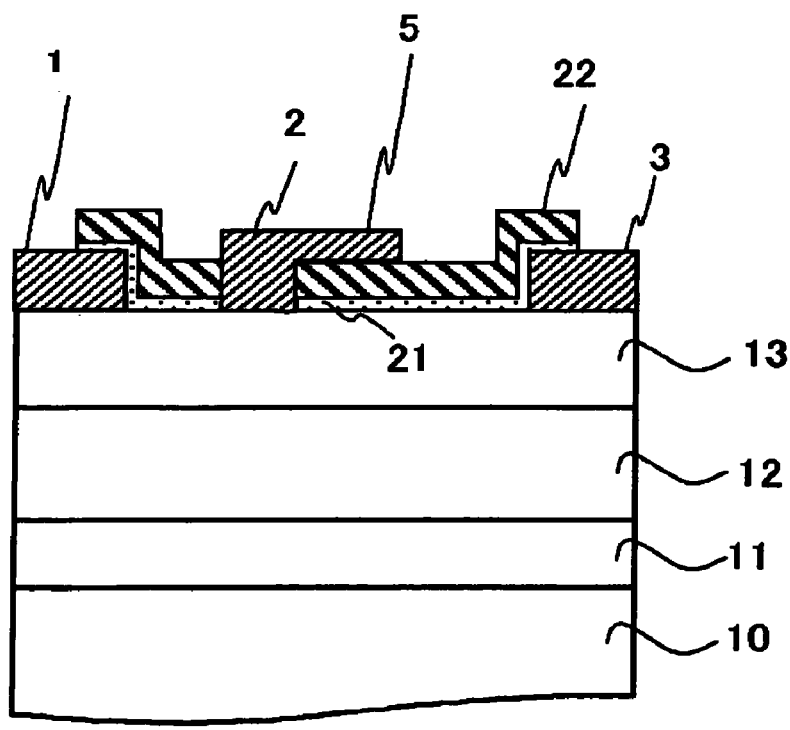

An inter-element separation mesa (not shown) is formed by etching a part of the epitaxial layer structure until the GaN channel layer 12 is exposed. Then, the source electrode 1 and the drain electrode 3 are formed on the AlGaN electron supply layer 13 by evaporating metal such as Ti/Al, and the ohmic contact is secured by performing anneal at 650° C. (FIG. 28B). Then, the SiN film 21 (film thickness of 50 nm) is formed by a plasma CVD method or the like. The $SiO_2$ film 22 (film thickness of 150 nm) is further formed on the SiN film 21 by a normal-pressure CVD method or the like (FIG. 29A). An opening, in which the AlGaN electron supply layer 13 is exposed, is provided by etching a part of the SiN film 21 and the $SiO_2$ film 22 (FIG. 29B). A gate metal 31 made of Ni/Au and the like is evaporated on the exposed AlGaN electron supply layer 13 by using a photo resist 30, and the Schottky-contact gate electrode 2 having the field plate portion 5 is formed (FIGS. 30A and 30B). Thus, HJFET shown in FIG. 1 is produced.

In Example 1, when high reverse voltage is applied between the gate and the drain, the electric field applied to the drain side end of the gate electrode is relaxed by the action of the field plate portion, which improves the gate breakdown voltage. Further, during the large signal operation, the surface potential is modulated by the field plate portion, so that the generation of the collapse caused by response of surface trap can be suppressed. Namely, the balance between the collapse and the gate breakdown voltage is remarkably improved. Further, even if the surface state is fluctuated by the variations in manufacturing process and the like, the good performance can stably be realized.

When compared with the conventional structure in which the area immediately below the field plate is formed of only SiN, the electric field applied to the insulating film located in the area immediately below the field plate portion can be reduced. The dielectric constant of $SiO_2$ is lower than that of SiN, and the aged deterioration in film quality of $SiO_2$ is hardly to occur. Therefore, the aged deterioration in film quality of the insulating film and the increase in capacity can be effectively suppressed in the area, thus obtaining the transistor which is excellent for the reliability and high-frequency gain.

Figure 24:
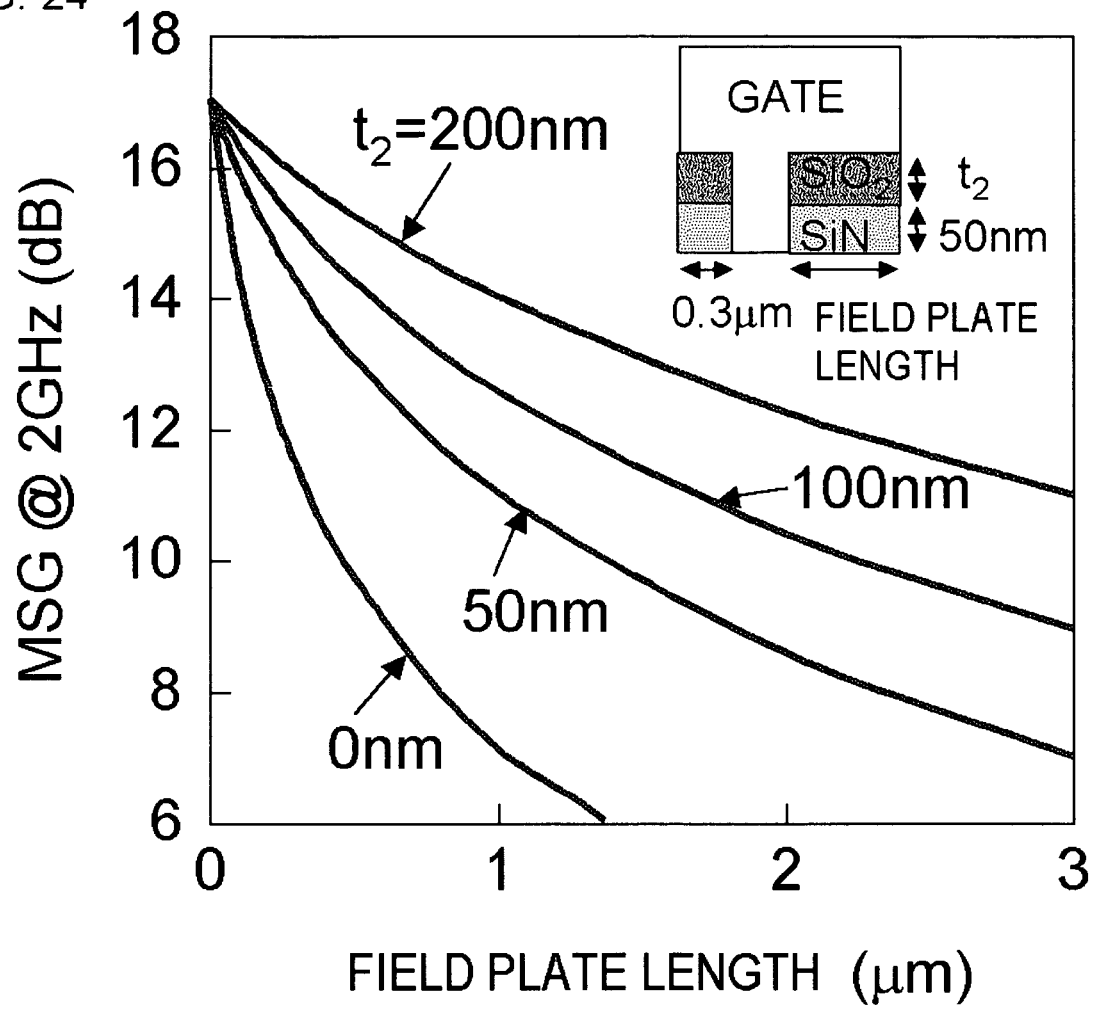
FIG. 24 is a view showing a performance evaluation result of a transistor according to an example.
Figure 25:
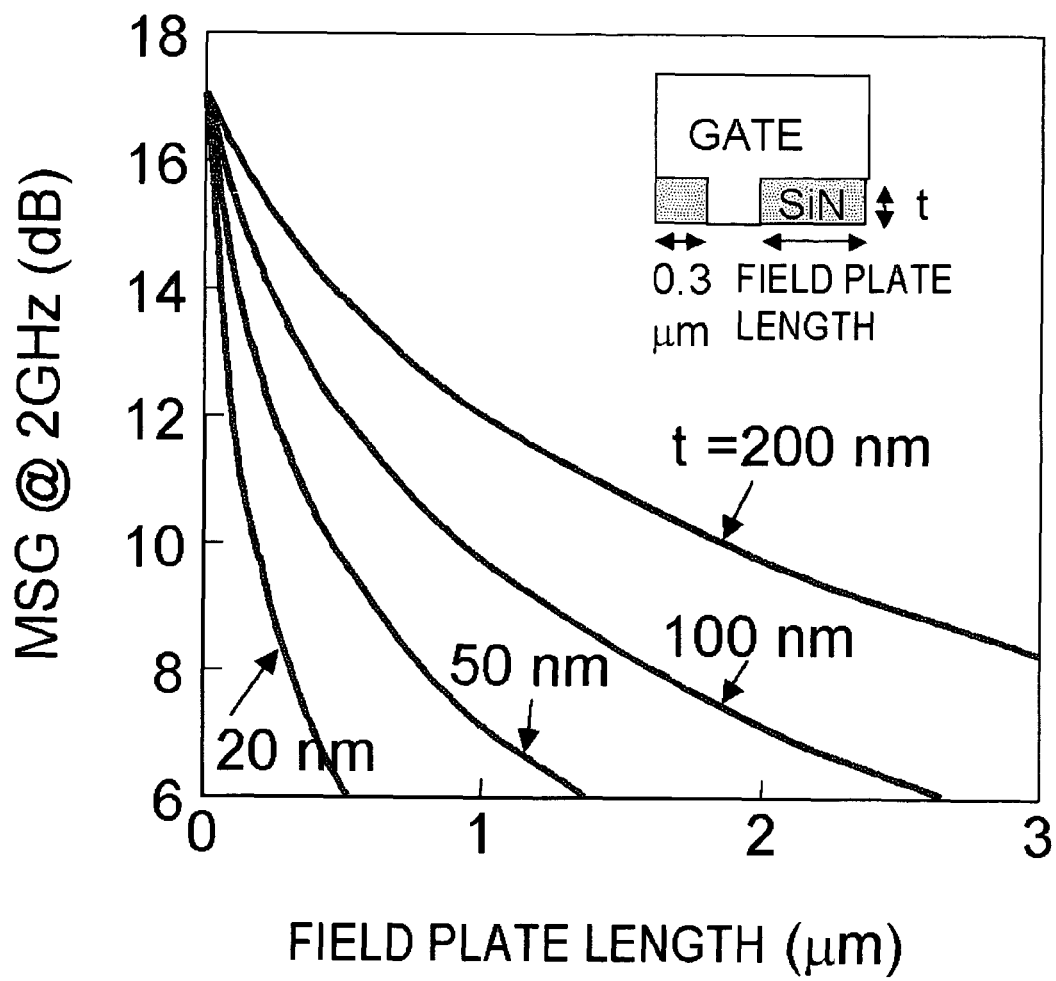
FIG. 25 is a view showing a performance evaluation result of a transistor according to an example.

FIG. 24 is a view showing a relationship between the $SiO_2$ film thickness and the gain in HJFET. When compared with HJFET having the conventional structure shown in FIG. 25, the gain is largely improved in HJFET shown in FIG. 24.

Figure 36:
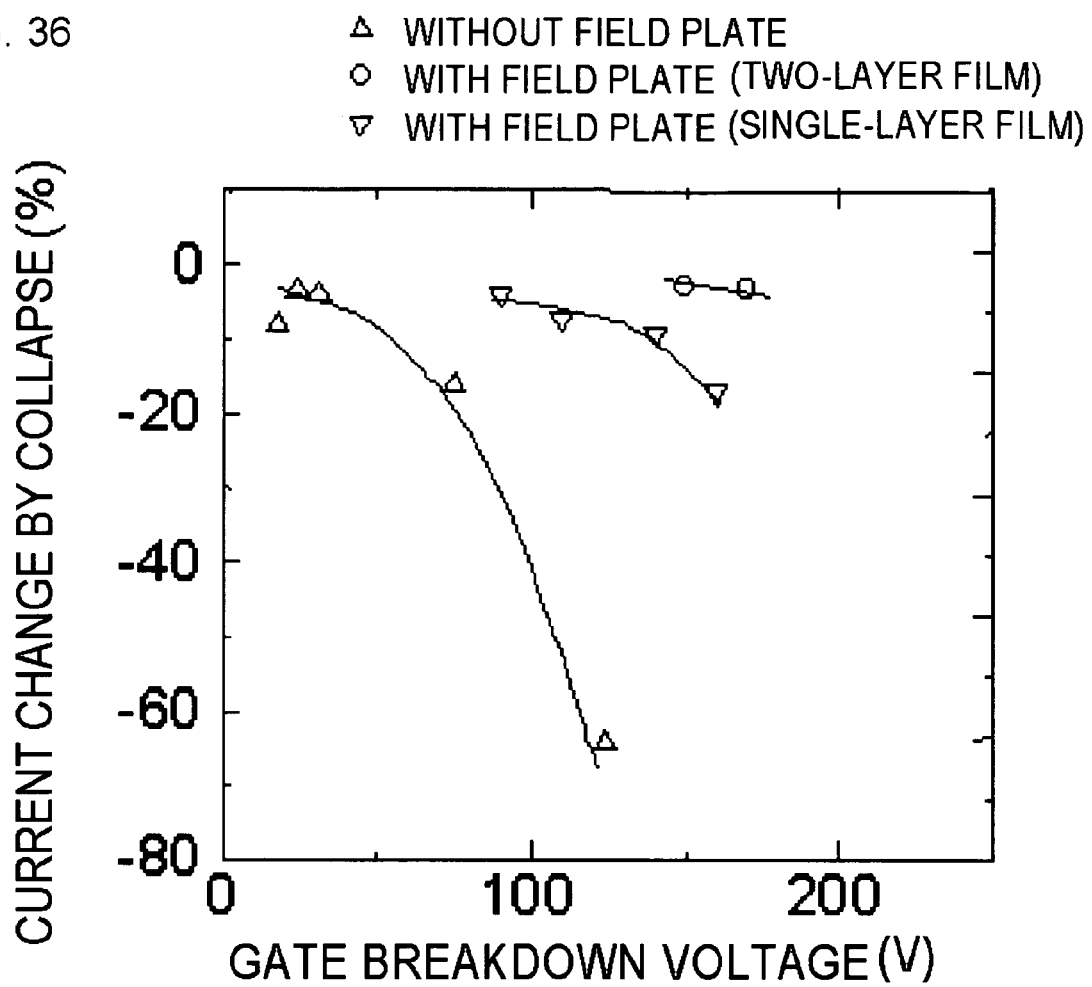
FIG. 36 is a view for explaining a trade-off between gate breakdown voltage and collapse.

FIG. 36 is a view in which the transistor according to Example 1 and the conventional transistor are compared to each other in the performance balance between the gate breakdown voltage and the collapse. The following prototype devices of Gr. 1 to Gr. 3 are similar to one another except for the shape of the gate electrode and the structure of the protection film. Gr. 1 field plate: presence protection film: laminated structure of a SiN film and a $SiO_2$ film plural devices in which the transistor according to Example 1 and the structure of the protection film are changed were evaluated.

Gr. 2 field plate: absence protection film: SiN film plural devices in which the structure of the protection film is changed were evaluated.

Gr. 3 field plate: presence protection film: SiN film plural devices in which the structure of the protection film is changed were evaluated.

From the comparison of Gr. 2 and Gr. 3, it is found that the trade-off between the gate breakdown voltage and the collapse still exists only when the field plate is simply provided on the SiN protection film. On the other hand, in the transistor according to Example 1 which corresponds to Gr. 1, it is found that the trade-off between the gate breakdown voltage and the collapse is eliminated and the good performance balance is exerted.

In Example 1, it is preferable that a size of the field plate extending onto the drain side is not lower than 0.3 μm. It is more preferable that the size of the field plate is not lower than 0.5 μm. It is preferable that the end of the field plate is located at a position where the end of the field plate does not overlap the drain electrode. As the size of the field plate is increased, the collapse suppression effect is increased. However, when the end of the field plate on the drain electrode side exceeds 70% of the distance between the gate electrode and the drain electrode, the gate breakdown voltage tends to be decreased, because the gate breakdown voltage is determined by the electric field concentration between the field plate and the drain electrode. Therefore, it is preferable that the size of the field plate is formed not more than 70% of the distance between the gate electrode and the drain electrode.

In Example 1, the $SiO_2$ film is formed as the upper layer of the surface protection film. From the viewpoints of the gain improvement and the reliability improvement, it is more preferable to use the low-dielectric-constant film having the dielectric constants not more than 4. SiOC (sometimes referred to as SiOCH), BCB (benzocyclobutene), FSG (flourosilicate glass: SiOF), HSQ (hydrogen-Silsesquioxane), MSQ (methyl-Silsesquioxane), an organic polymer, and a material in which these are formed in porous can be cited as an example of the low-dielectric-constant material.

Example 2

Figure 2:
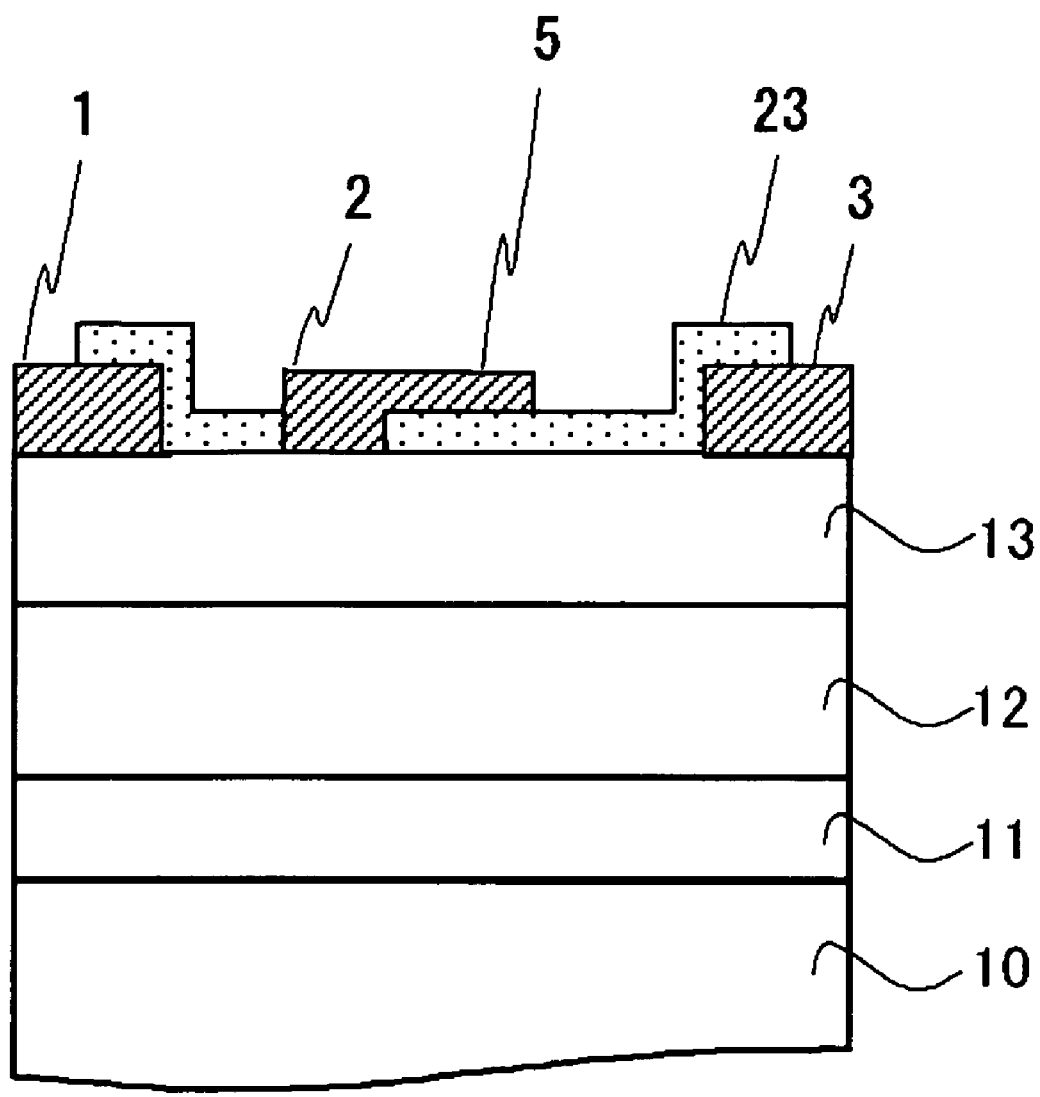
FIG. 2 is a view showing a transistor structure according to an example.

FIG. 2 shows a sectional structure of HJFET in Example 2. HJFET is formed on the substrate 10 made of the material such as SiC. The buffer layer 11 including the semiconductor layer is formed on the substrate 10. The GaN channel layer 12 is formed on the buffer layer 11. The AlGaN electron supply layer 13 is formed on the GaN channel layer 12. The source electrode 1 and drain electrode 3, in which the ohmic contact is secured, are formed on the electron supply layer. The gate electrode 2, in which the Schottky contact is secured, is provided between the source electrode 1 and the drain electrode 3. The gate electrode 2 has the field plate portion 5 overhanging the drain side in the visored shape. The surface of the electron supply layer 13 is covered with a SiON film 23, and the SiON film 23 is provided immediately below the field plate portion 5.

HJFET according to Example 2 is formed as follows: At first, the semiconductor is grown on the substrate 10 made of SiC, e.g., by the molecular beam epitaxy growth method. Similarly, the buffer layer 11 (film thickness of 20 nm) made of undoped AlN, the channel layer 12 (film thickness of 2 μm) made of undoped GaN, and the AlGaN electron supply layer 13 (film thickness of 25 nm) made of undoped $Al_{0.2}Ga_{0.8}N$ are laminated in the order from the substrate side, which obtains the semiconductor layer.

Figure 3:
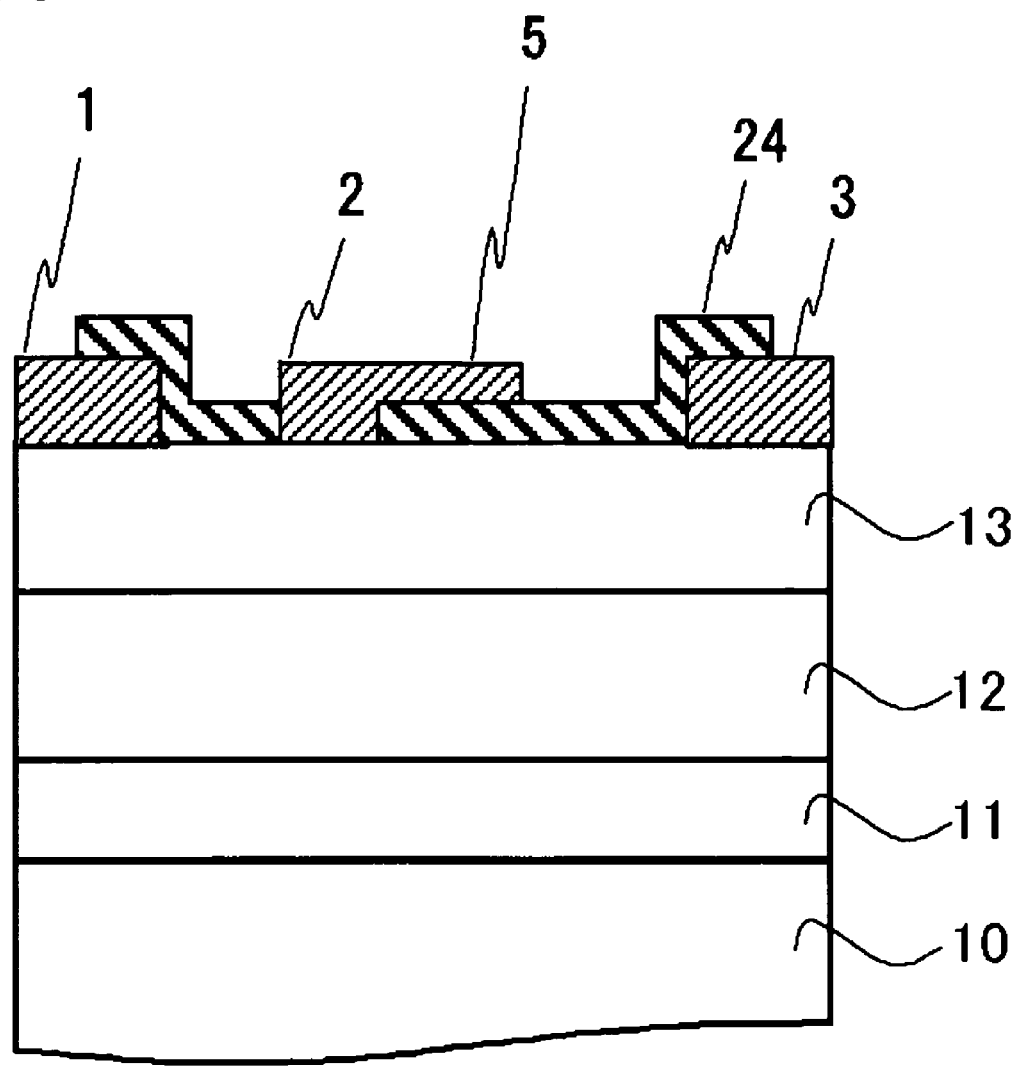
FIG. 3 is a view showing a transistor structure according to an example.

Then, the inter-element separation mesa is formed by etching a part of the epitaxial layer structure until the GaN channel layer 12 is exposed. Then, the source electrode 1 and the drain electrode 3 are formed on the AlGaN electron supply layer 13 by evaporating the metal such as Ti/Al, and the ohmic contact is secured by performing the anneal at 650° C. Then, the SiON film 23 (film thickness of 150 nm) is formed by the plasma CVD method or the like. The metal made of Ni/Au and the like is evaporated on the AlGaN electron supply layer 13 exposed by etching a part of the SiON film 23, and the Schottky-contact gate electrode 2 having the field plate portion 5 is formed. Thus, HJFET shown in FIG. 3 is produced.

Figure 35:
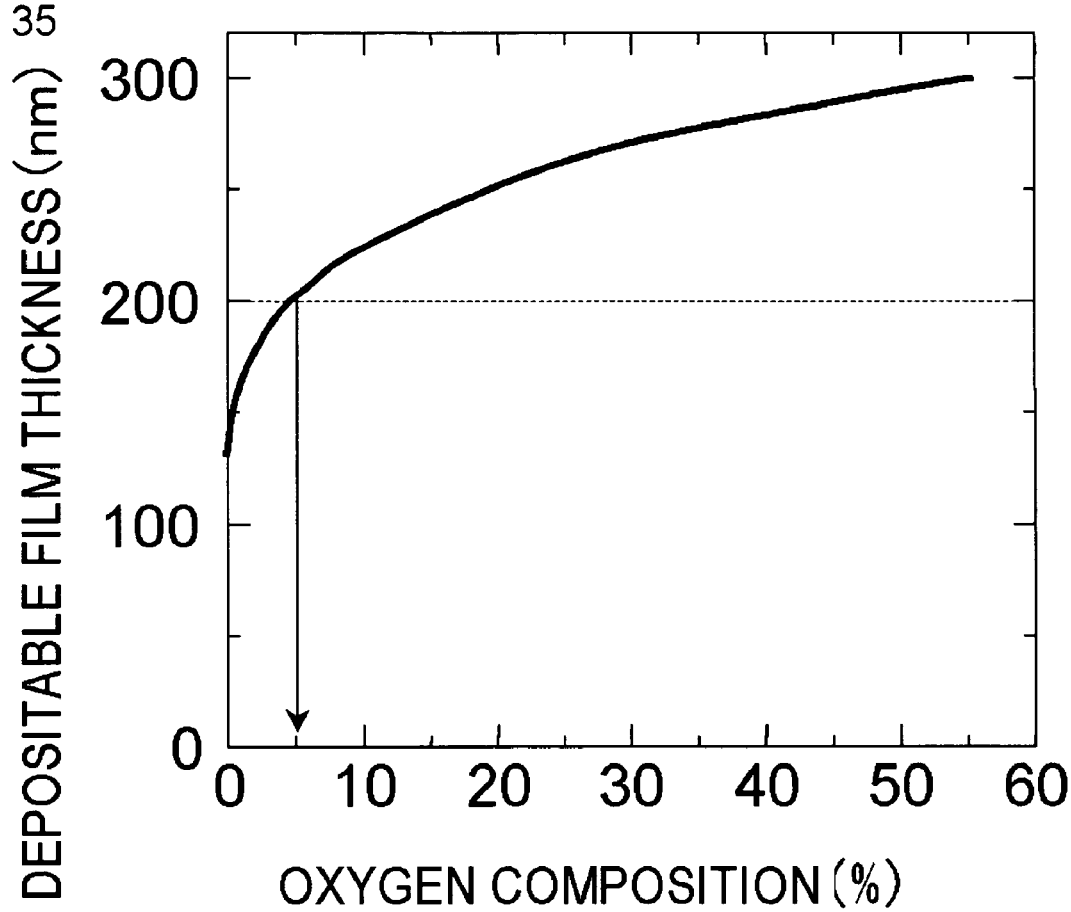
FIG. 35 is a view for explaining a film thickness of SiON which can be deposited.

In the transistor of Example 2, the SiON film is used as the surface protection film. When compared with the SiN film, the SiON film has the smaller internal stress generated in the film. FIG. 35 is a view showing a result of study on the film thickness in which the film can be grown without generating crack when the SiON film and the SiN film are deposited by the plasma CVD method. In this case, an oxygen content ratio in SiON is changed to study the corresponding growable film thickness. It is found that the growable film thickness is increased as the oxygen content ratio is increased. Namely, when compared with the case in which the SiN film is formed below the field plate, in Example 2, the insulating film can be formed thicker, and the high-frequency gain can be improved by the decrease in capacity below the field plate. As can be seen from FIG. 35, since the growable film thickness is about 150 nm without generating the crack in SiN containing no oxygen, it is preferable that the SiN film thickness in the insulating film is not more than 150 nm below the field plate portion.

At this point, from the viewpoints of the collapse and the high-frequency gain, it is desirable that the thickness of the SiON film is formed not lower than 200 nm below the field plate. Since the oxygen content ratio corresponding to the growable film thickness of 200 nm is 5% (in terms of mole), when the SiON film is used, it is preferable that the oxygen content ratio is not lower than 5%. On the other hand, when the oxygen content ratio becomes too large, the collapse improvement effect is not sufficiently obtained. According to the study of the inventor, from the viewpoint of the collapse improvement, it is preferable that the oxygen proportion is not more than 50%. In the case of conversion into a refractive index, it is preferable that the refractive index ranges from 1.6 to 2.0.

In Example 2, it is preferable that the size of the field plate is not lower than 0.3 μm. It is more preferable that the size of the field plate is not lower than 0.5 μm. It is preferable that the end of the field plate is located at the position where the end of the field plate does not overlap the drain electrode. It is more preferable that the size of the field plate is formed not more than 70% of the distance between the gate electrode and the drain electrode.

Example 3

Referring to FIG. 3, Example 3 of the invention will be described below.

FIG. 3 shows a sectional structure of HJFET in Example 3. HJFET is formed on the substrate 10 made of the material such as SiC. The buffer layer 11 including the semiconductor layer is formed on the substrate 10. The GaN channel layer 12 is formed on the buffer layer 11. The AlGaN electron supply layer 13 is formed on the GaN channel layer 12. The source electrode 1 and drain electrode 3, in which the ohmic contact is secured, are formed on the electron supply layer. The gate electrode 2, in which the Schottky contact is secured, is provided between the source electrode 1 and the drain electrode 3. The gate electrode 2 has the field plate portion 5 overhanging the drain side in the visored shape. The surface of the electron supply layer 13 is covered with a SiOC film 24, and the SiOC film 24 is provided immediately below the field plate portion 5.

HJFET according to Example 3 is formed as follows: At first, the semiconductor is grown on the substrate 10 made of SiC, e.g., by the molecular beam epitaxy growth method. Similarly, the buffer layer 11 (film thickness of 20 nm) made of undoped AlN, the channel layer 12 (film thickness of 2 μm) made of undoped GaN, and the AlGaN electron supply layer 13 (film thickness of 25 nm) made of undoped $Al_{0.2}Ga_{0.8}N$ are laminated in the order from the substrate side, which obtains the semiconductor layer structure.

Then, the inter-element separation mesa is formed by etching a part of the epitaxial layer structure until the GaN channel layer 12 is exposed. Then, the source electrode 1 and the drain electrode 3 are formed on the AlGaN electron supply layer 13 by evaporating the metal such as Ti/Al, and the ohmic contact is secured by performing the anneal at 650° C. Then, the SiOC film 24 (film thickness of 200 nm) is formed by the plasma CVD method. The metal made of Ni/Au and the like is evaporated on the AlGaN electron supply layer 13 exposed by etching a part of the SiON film 24, and the Schottky-contact gate electrode 2 having the field plate portion 5 is formed. Thus, HJFET shown in FIG. 3 is produced.

In Example 3, the SiOC film is used as the surface protection film. When compared with the SiN film, the SiOC film has the smaller stress, and the SiOC film does not affect the piezo polarization of the AlGaN layer, even if the film thickness is increased. Therefore, the surface charge is controlled to suppress the collapse by the field plate, however, the SiOC film has no collapse suppression effect. In Example 3, it is preferable that the size of the field plate is not lower than 0.3 μm. It is more preferable that the size of the field plate is not lower than 0.5 μm. It is preferable that the end of the field plate is located at the position where the end of the field plate does not overlap the drain electrode. It is more preferable that the size of the field plate is formed not more than 70% of the distance between the gate electrode and the drain electrode.

In Example 3, the SiOC film having the dielectric constant of about 2.5 is used as the surface protection film. In addition, it is also possible that other low-dielectric constant films (dielectric constants not more than 3.5) are used as the surface protection film. In this case, it is preferable to use the film in which the smaller stress (internal stress) is generated. SiOC (sometimes referred to as SiOCH), BCB (benzocyclobutene), FSG (flourosilicate glass: SiOF), HSQ (hydrogen-Silsesquioxane), MSQ (methyl-Silsesquioxane), the organic polymer, and the material in which these are formed in porous can be cited as an example of the low-dielectric-constant material. In addition, it is also possible that alumina and the like are used as the surface protection film. Further, when AlN having the film thicknesses of not more than the critical film thickness is used as the surface protection film, the effect of increasing heat dissipation from the element surface is obtained in addition to the field plate effect. In the multi-layered film structure in which these films are combined, the same effect is also obtained.

Example 4

Example 4 has the protection film structure in which a single-layer structure is formed near the gate electrode and a double-layer structure is formed in the area away from the gate electrode. Because the semiconductor layer structure below the gate electrode is similar to the above examples, the description of the semiconductor layer structure will be neglected.

Figure 4A:
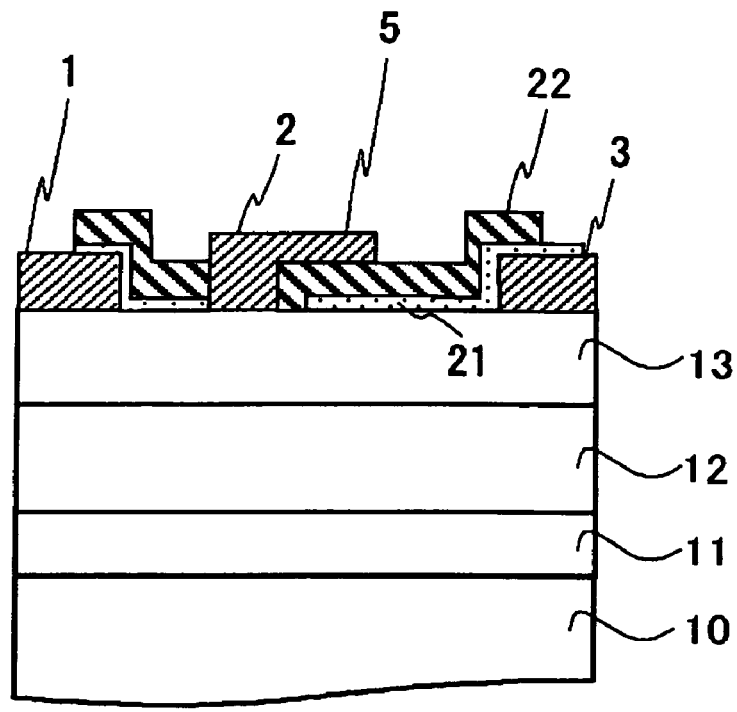
FIGS. 4A and 4B are views showing a transistor structure according to an example.

In FIG. 4A, the gate electrode 2 and the SiN film 21 are formed while being separated from each other. A first area and a second area are formed below the field plate portion 5. The first area is formed by the single-layer of the SiO$_2$ film 22. The second area is positioned on the drain side, and is formed by laminating the SiO$_2$ film 22 on the SiN film 21. A degree of the electric field relaxation effect by the field plate portion 5 depends on these areas, and the electric field concentration can further effectively be relaxed in the drain side end portion of the gate electrode 2.

Figure 4B:
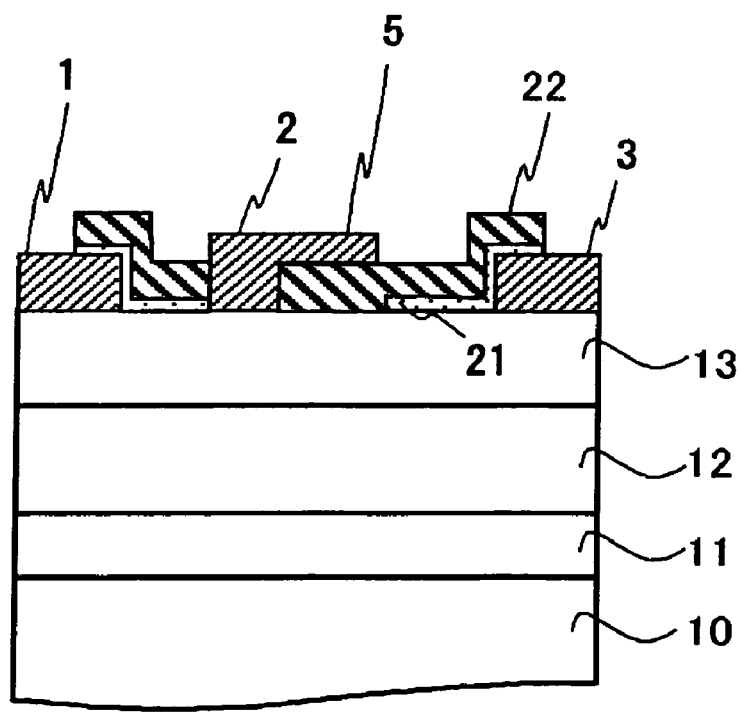

In FIG. 4B, the gate electrode 2 and the SiN film 21 are formed while further separated from each other so that the field plate portion 5 and the SiN film 21 do not overlap each other. Therefore, the single-layer of the SiO$_2$ film 22 is formed immediately below the field plate portion 5, and the multi layered film of the SiN film 21 and the SiO$_2$ film 22 is formed in the area except for the field plate portion 5 forming area in the area between the gate electrode 2 and the drain electrode 3. The transistor of Example 4 has the structure which is particularly excellent for high-frequency properties, and the decrease in capacity is realized to remarkably improve the gain below the field plate portion 5 by using SiO$_2$. On the other hand, in the area except for the field plate portion 5 forming area, the collapse generation caused by the surface trap response is suppressed by forming the film including the SiN film 21.

Figure 31A:
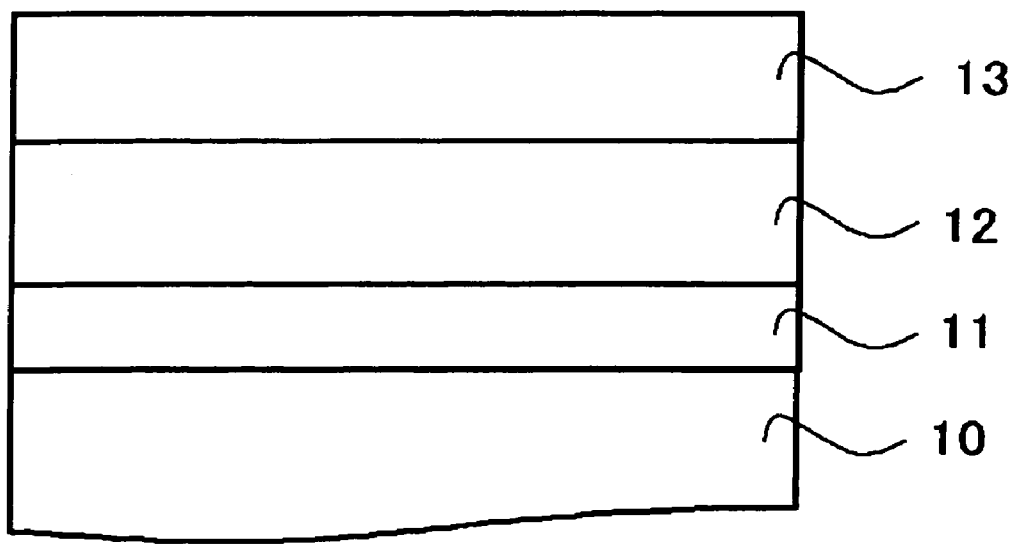
FIGS. 31A and 31B are views showing a transistor manufacturing method according to an example.

Referring to FIGS. 31A to 34B, the method of manufacturing HJFET according to Example 4 will be described below. At first, the semiconductor is grown on the substrate 10 made of SiC, e.g., by the molecular beam epitaxy (MBE) growth method. Similarly, the buffer layer 11 (film thickness of 20 nm) made of undoped AlN, the channel layer 12 (film thickness of 2 μm) made of undoped GaN, and the AlGaN electron supply layer 13 (film thickness of 25 nm) made of undoped Al$_{0.2}$Ga$_{0.8}$N are laminated in the order from the substrate side, which obtains the semiconductor layer structure (FIG. 31A).

Figure 31B:
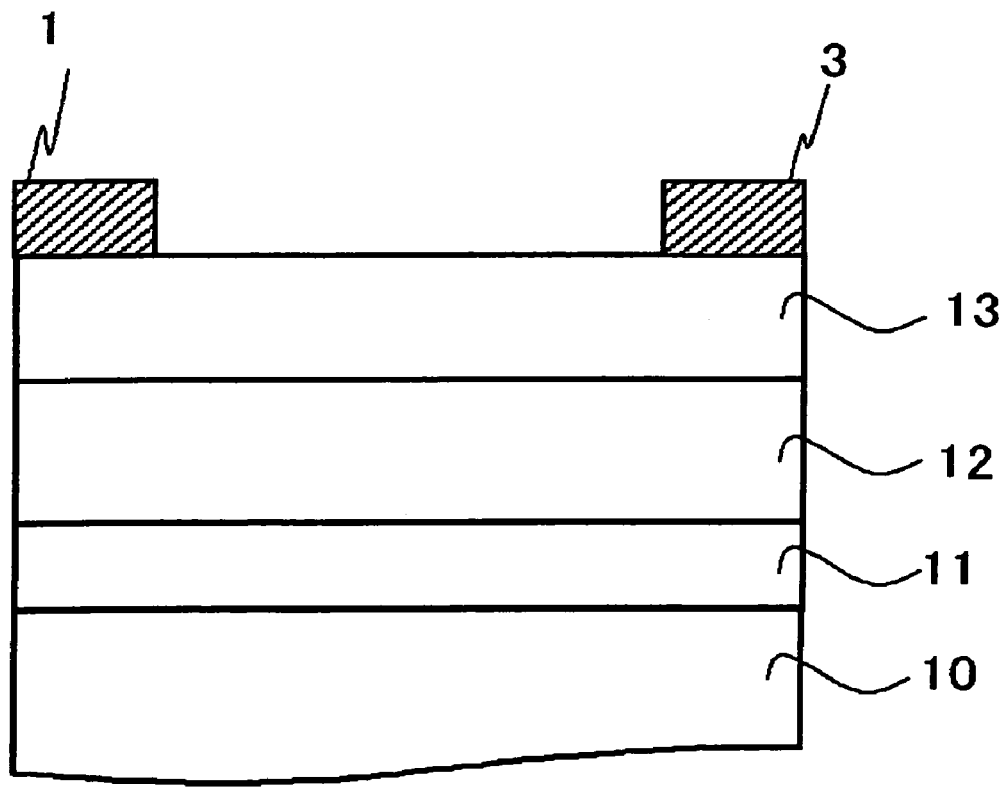
Figure 32A:
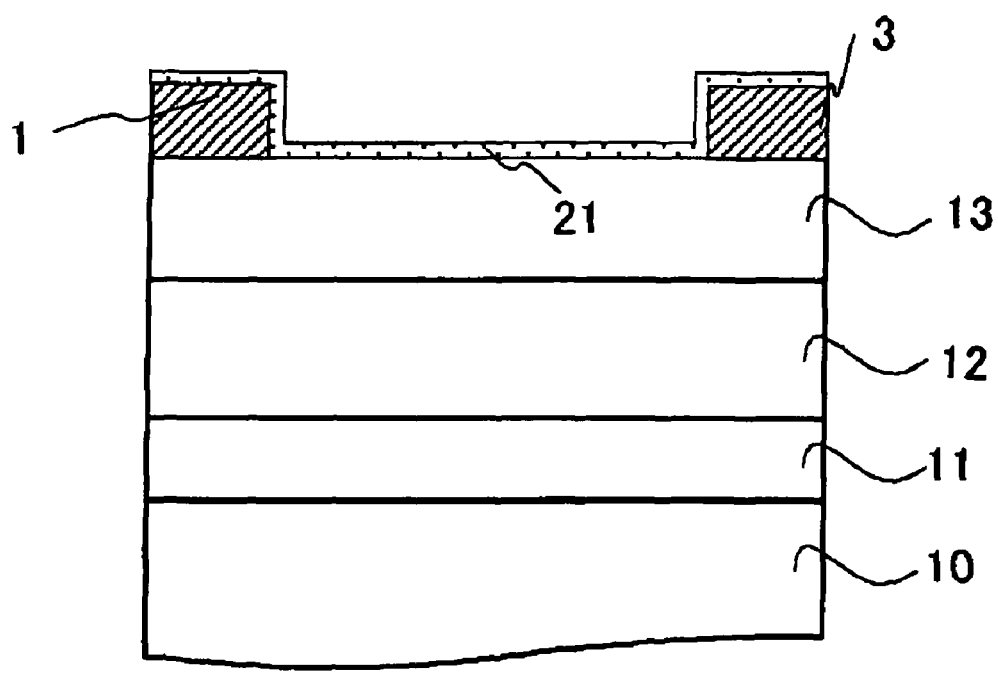
FIGS. 32A and 32B are views showing a transistor manufacturing method according to an example.
Figure 32B:
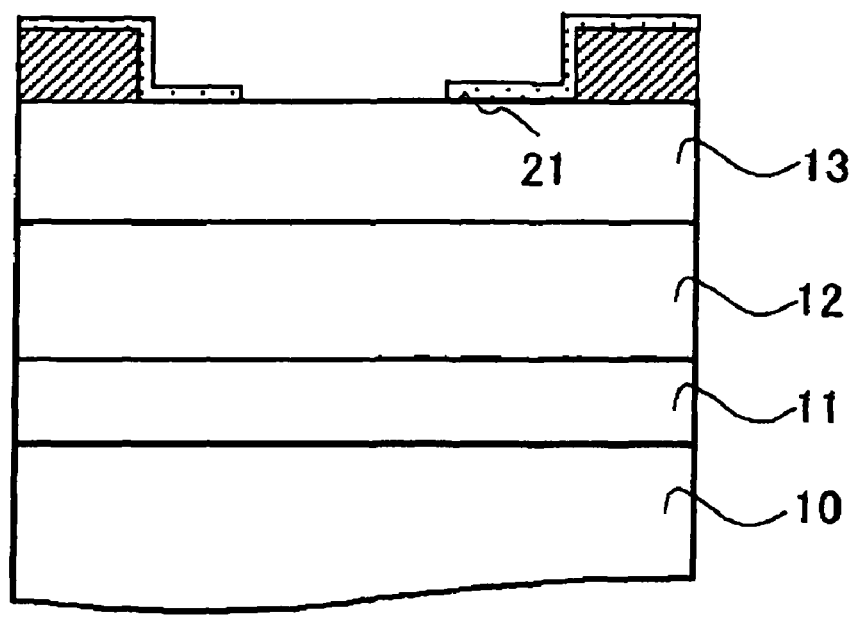
Figure 33A:
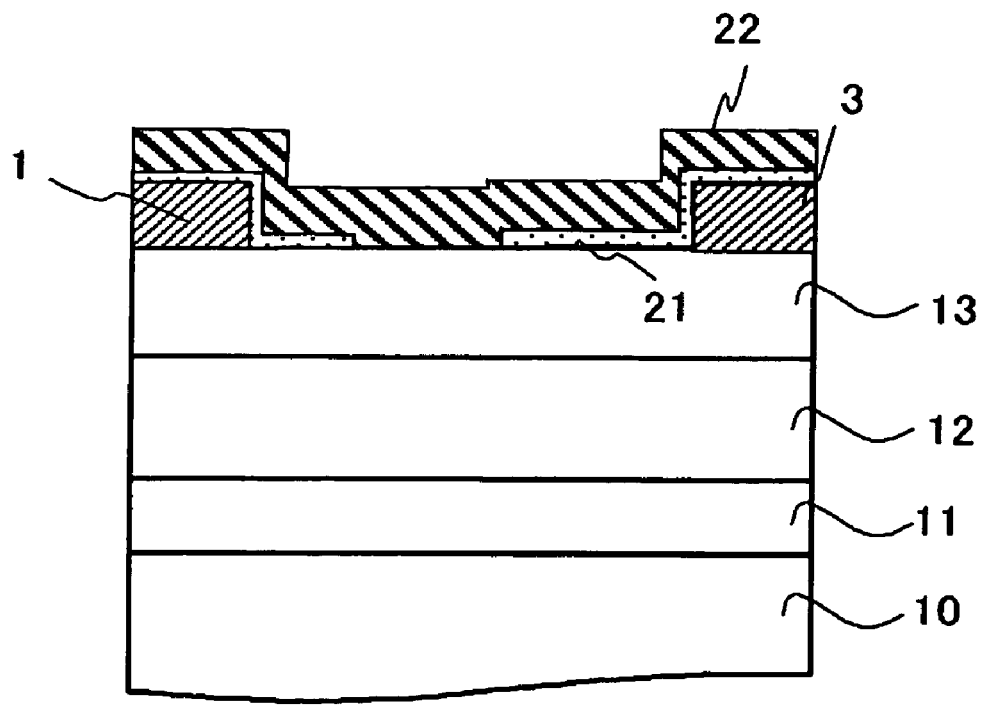
FIGS. 33A and 33B are views showing a transistor manufacturing method according to an example.
Figure 33B:
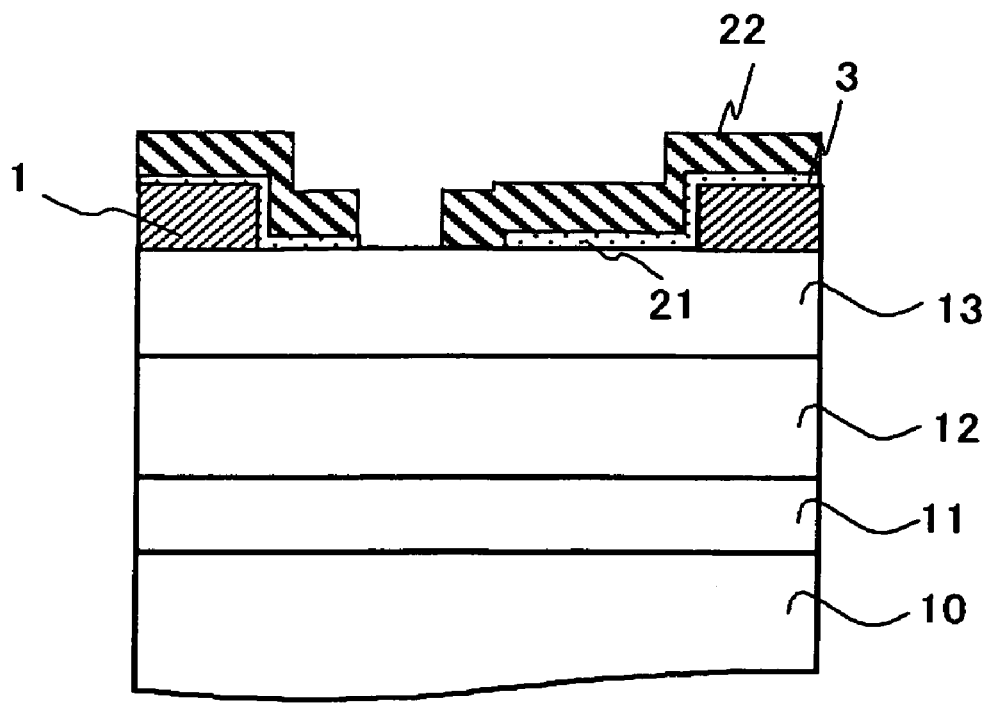
Figure 34A:
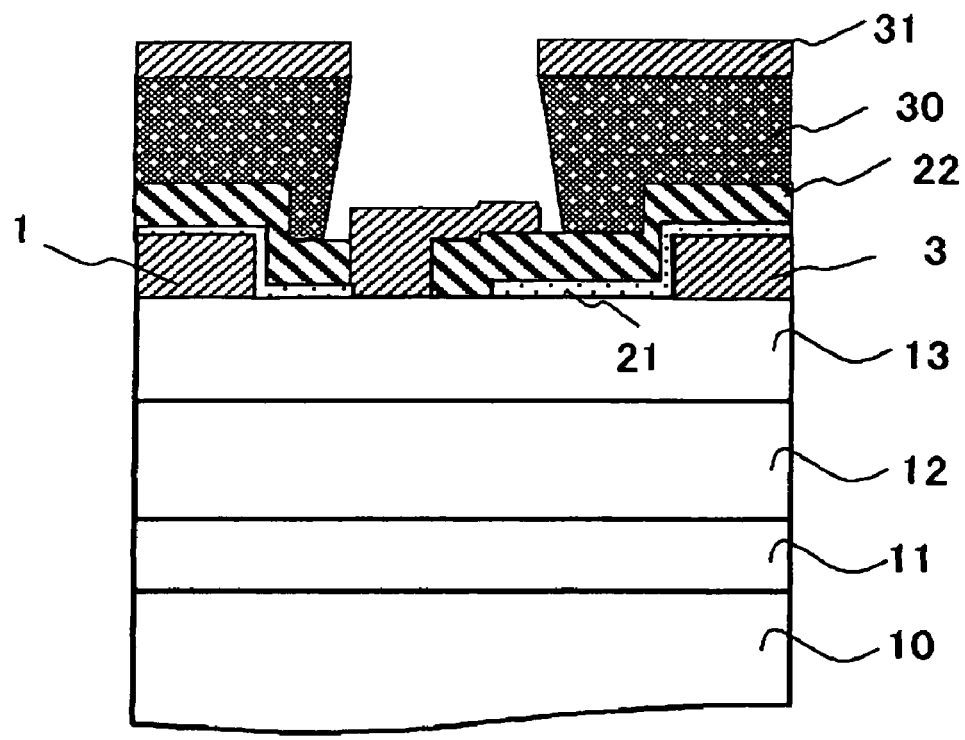
FIGS. 34A and 34B are views showing a transistor manufacturing method according to an example.
Figure 34B:
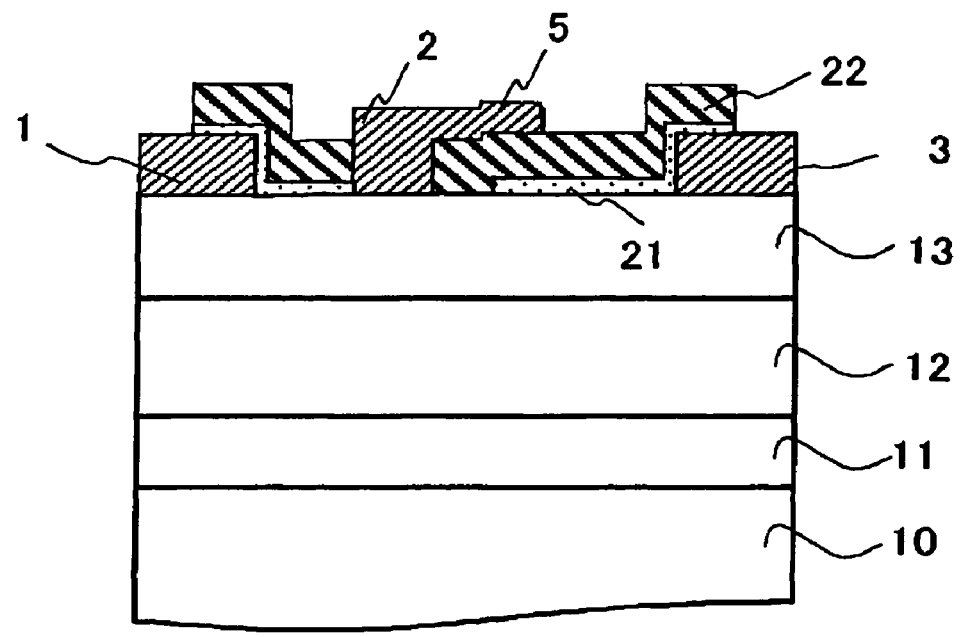

Then, the inter-element separation mesa (not shown) is formed by etching a part of the epitaxial layer structure until the GaN channel layer 12 is exposed. Then, the source electrode 1 and the drain electrode 3 are formed on the AlGaN electron supply layer 13 by evaporating the metal such as Ti/Al, and the ohmic contact is secured by performing the anneal at 650° C. (FIG. 31B). Then, the SiN film 21 (film thickness of 50 nm) is formed by the plasma CVD method or the like (FIG. 32A). Then, the opening in which the AlGaN electron supply layer 13 is exposed is provided by etching a part of the SiN film 21 (FIG. 32B). The SiO$_2$ film 22 (film thickness of 150 nm) is formed over the substrate by the normal-pressure CVD method or the like so that the opening is embedded (FIG. 33A). Then, the opening in which the AlGaN electron supply layer 13 is exposed is provided by etching a part of the SiO$_2$ film 22 (FIG. 33B). Then, the gate metal 31 made of Ni/Au and the like is evaporated on the exposed AlGaN electron supply layer 13 by using the photo resist 30, and the Schottky-contact gate electrode 2 having the field plate portion 5 is formed (FIGS. 34A and 34B). Thus, HJFET shown in FIG. 1 is produced.

The transistor shown in FIG. 4 can be stably manufactured by the above procedure.

Example 5

In Example 5, the protection film is formed in stepwise, the single-layer structure is formed near the gate electrode, and the double-layer structure is formed in the area away from the gate electrode. Because the semiconductor layer structure below the gate electrode is similar to the above examples, the description of the semiconductor layer structure will be neglected.

Figure 5:
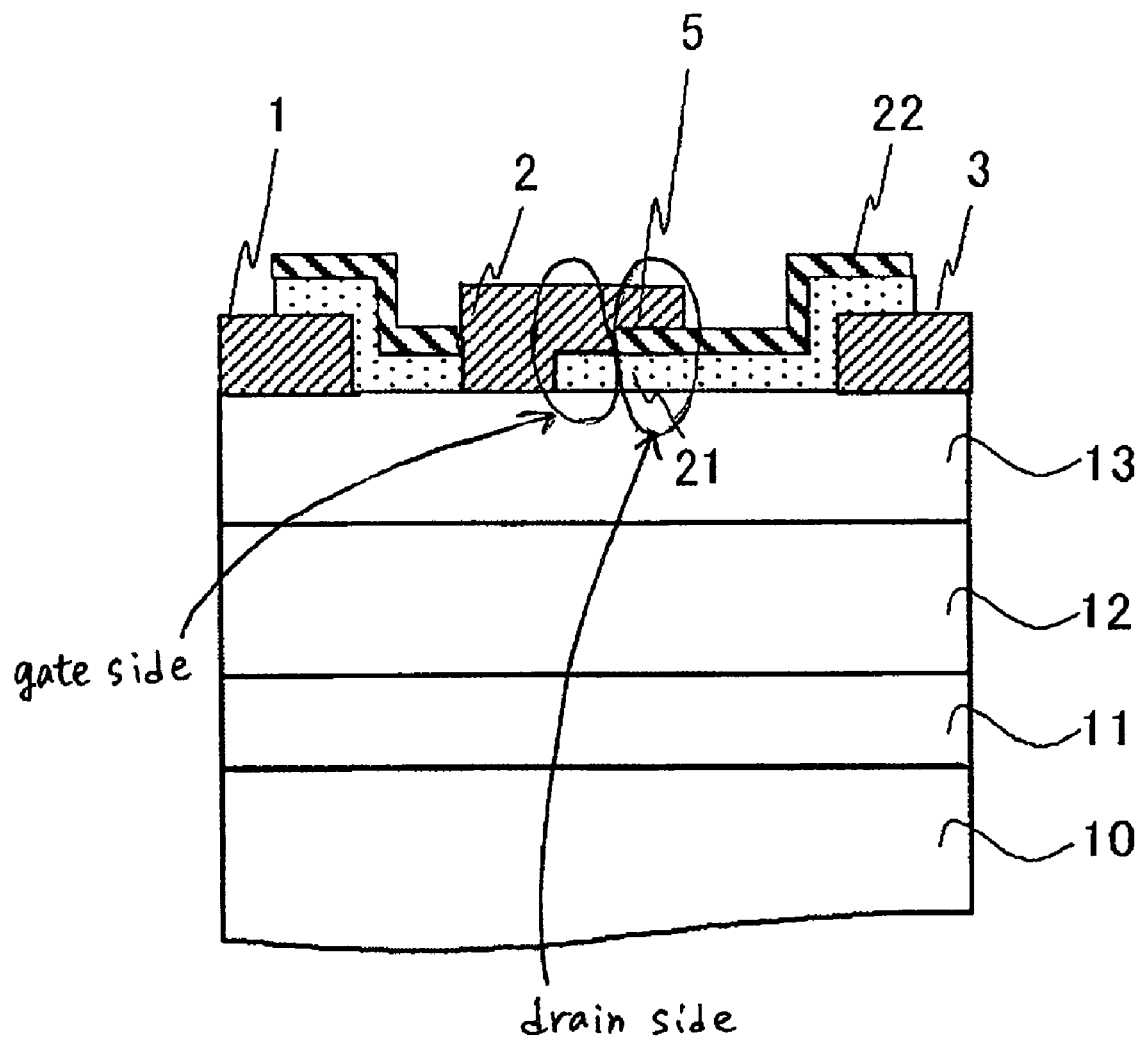
FIG. 5 is a view showing a transistor structure according to an example.

FIG. 5 shows the transistor structure according to Example 5. The first area and the second area are formed below the field plate portion 5. The first area is formed by the single-layer of the SiN film 21. The second area is positioned on the drain side, and is formed by laminating the SiO$_2$ film 22 on the SiN film 21. The degree of the electric field relaxation effect by the field plate portion 5 depends on these areas, and the electric field concentration can further effectively be relaxed in the drain side end portion of the gate electrode 2. Particularly, in this case, the drain electrode 3 side is lower than the gate electrode 2 side in the dielectric constant of the insulating film below the field plate portion 5. Therefore, the electric field concentration can effectively be relaxed on the gate electrode drain side.

Example 6

Figure 6:
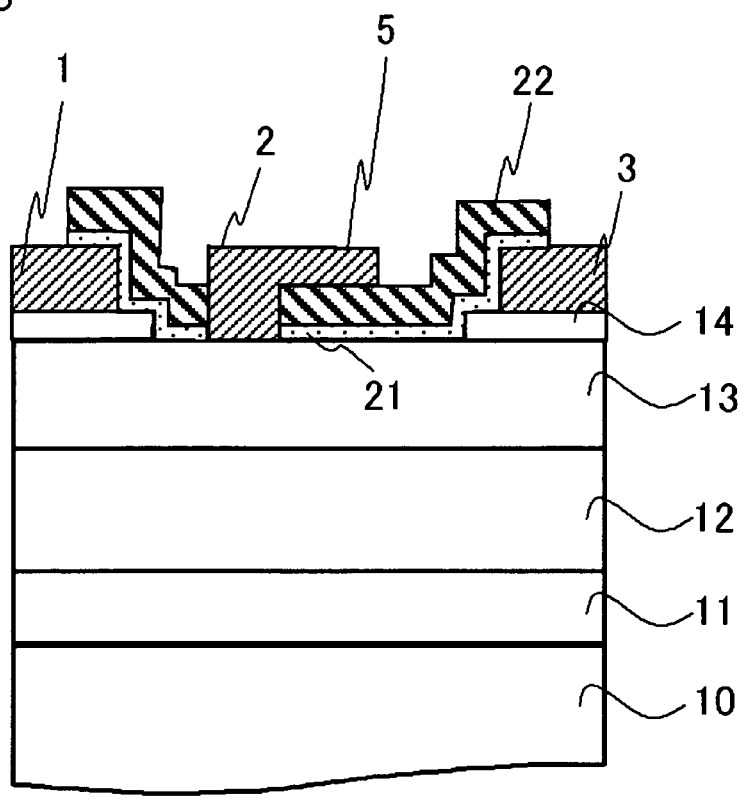
FIG. 6 is a view showing a transistor structure according to an example.

Example 6 is an example of HJFET in which the wide recess structure is adopted. Referring to FIG. 6, Example 6 will be described below.

HJFET is formed on the substrate 10 made of SiC or the like. The source electrode 1 and the drain electrode 3 are formed on GaN contact layers 14, respectively. The buffer layer 11 including the semiconductor layer is formed on the substrate 10. The GaN channel layer 12 is formed on the buffer layer 11. The AlGaN electron supply layer 13 is formed on the GaN channel layer 12. The GaN contact layers 14 are located on the AlGaN electron supply layer 13. The source electrode 1 and the drain electrode 3, in which the ohmic contact is secured, are formed while being in contact with the contact layers 14, respectively. The gate electrode 2, in which the Schottky contact is secured, is provided by removing a part of the contact layer 14 between the source electrode 1 and the drain electrode 3. The gate electrode 2 has the field plate portion 5 overhanging the drain side in the visored shape while being in contact with the exposed AlGaN electron supply layer 13. The surface of the electron supply layer 13 is covered with the SiN film 21, and the SiO$_2$ film 22 is further provided on the SiN film 21. The SiN film 21 and the SiO$_2$ film 22 are provided immediately below the field plate portion 5.

Example 6 has the structure in which the contact layer is added to Example 1. In addition to the effects described in Example 1, contact resistance can further be reduced.

Because an electric field distribution is changed in the drain side end portion of the gate electrode 2 by adopting the wide recess structure, the further excellent electric field relaxation effect is obtained by combining with the function of the field plate portion 5.

In Example 6, it is preferable that the size of the field plate is not lower than 0.3 μm. It is more preferable that the size of the field plate is not lower than 0.5 μm. It is preferable that the end of the field plate is located at the position where the end of the field plate does not overlap the contact layer. It is more preferable that the size of the field plate is formed not more than 70% of the distance between the gate electrode and the drain electrode.

Example 7

Figure 7:
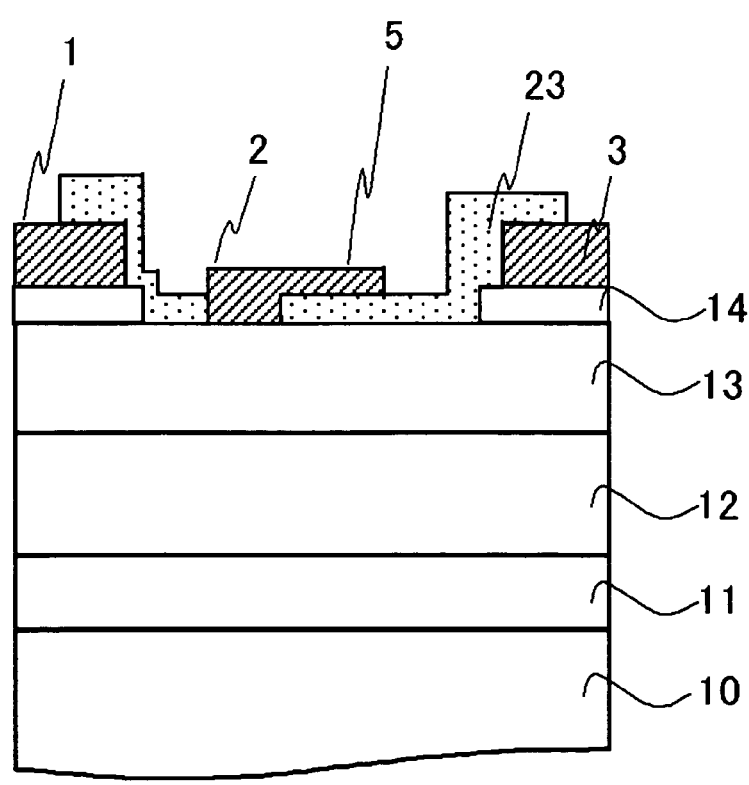
FIG. 7 is a view showing a transistor structure according to an example.

Example 7 is an example of HJFET in which the wide recess structure is adopted. Referring to FIG. 7, Example 7 will be described below.

HJFET is formed on the substrate 10 made of SiC or the like. The source electrode 1 and the drain electrode 3 are formed on the GaN contact layers 14, respectively. The buffer layer 11 including the semiconductor layer is formed on the substrate 10. The GaN channel layer 12 is formed on the buffer layer 11. The AlGaN electron supply layer 13 is formed on the GaN channel layer 12. The GaN contact layers 14 are located on the AlGaN electron supply layer 13. The source electrode 1 and the drain electrode 3, in which the ohmic contact is secured, are formed while being in contact with the contact layers 14, respectively. The gate electrode 2, in which the Schottky contact is secured, is provided by removing a part of the contact layer 14 between the source electrode 1 and the drain electrode 3. The gate electrode 2 has the field plate portion 5 which is in contact with the exposed AlGaN electron supply layer 13. The element surface is covered with the SiON film 23. The SiON film 23 is provided immediately below the field plate portion 5.

Example 7 has the structure in which the contact layer is added to Example 2. In addition to the effects described in Example 2, the contact resistance can further be reduced.

Because the electric field distribution is changed in the drain side end portion of the gate electrode 2 by adopting the wide recess structure, the further excellent electric field relaxation effect is obtained by combining with the function of the field plate portion 5.

In the SiON film of Example 7, it is preferable that the refractive index ranges from 1.6 to 2.0.

In Example 7, it is preferable that the size of the field plate is not lower than 0.3 µm. It is more preferable that the size of the field plate is not lower than 0.5 µm. It is preferable that the end of the field plate is located at the position where the end of the field plate does not overlap the contact layer. It is more preferable that the size of the field plate is formed not more than 70% of the distance between the gate electrode and the drain electrode.

Example 8

Figure 8:
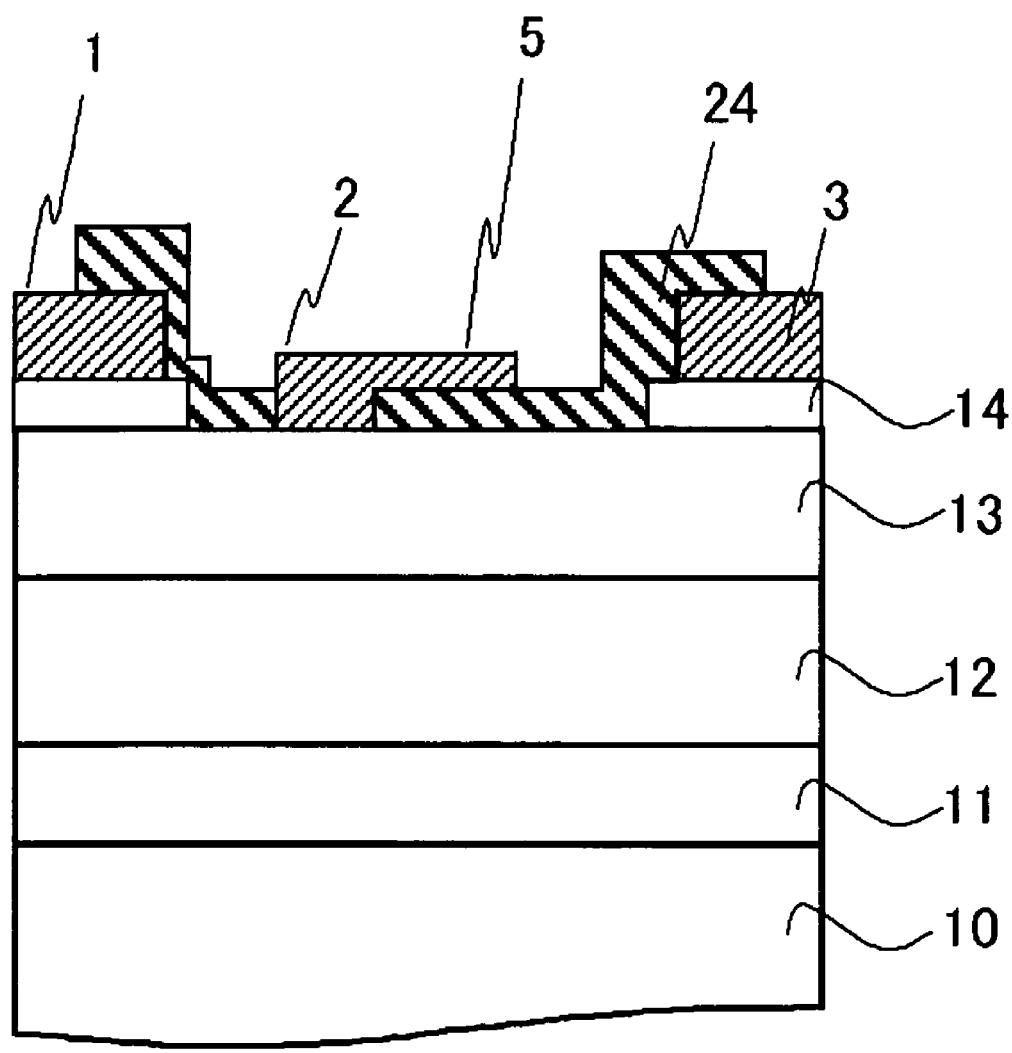
FIG. 8 is a view showing a transistor structure according to an example.

FIG. 8 shows a sectional structure of HJFET according to Example 8. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the GaN channel layer 12. The contact layers 14 are located on the electron supply layer 13. The source electrode 1 and the drain electrode 3, in which the ohmic contact is secured, are formed while being in contact with the contact layers, respectively. The gate electrode 2, in which the Schottky contact is secured, is provided by removing a part of the contact layer between the source electrode 1 and the drain electrode 3. The gate electrode 2 has the field plate portion 5 which is in contact with the exposed AlGaN electron supply layer 13. The element surface is covered with the SiOC film 24. The SiOC film 24 is provided immediately below the field plate portion 5.

Example 8 has the structure in which the contact layer is added to Example 3. In addition to the effects described in Example 3, the contact resistance can further be reduced.

Because the electric field distribution is changed in the drain side end portion of the gate electrode 2 by adopting the wide recess structure, the further excellent electric field relaxation effect is obtained by combining with the function of the field plate portion 5.

In Example 8, it is preferable that the size of the field plate is not lower than 0.3 µm. It is more preferable that the size of the field plate is not lower than 0.5 µm. It is preferable that the end of the field plate is located at the position where the end of the field plate does not overlap the contact layer. It is more preferable that the size of the field plate is formed not more than 70% of the distance between the gate electrode and the drain electrode.

Example 9

Figure 9:
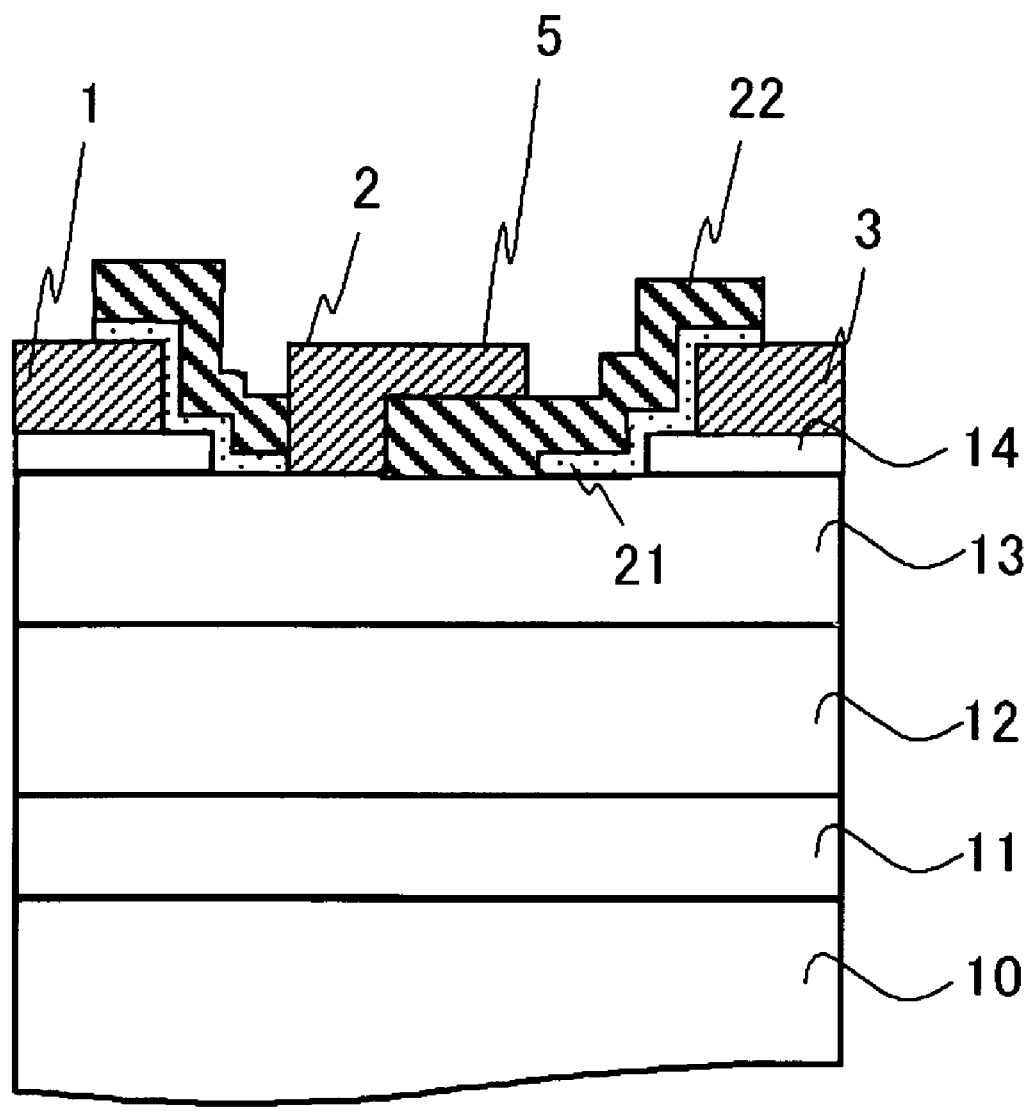
FIG. 9 is a view showing a transistor structure according to an example.

FIG. 9 shows a sectional structure of HJFET according to Example 9. Example 9 has the structure in which the contact layer is added to Example 4. Because the semiconductor layer structure is similar to Example 4, the description will be neglected. According to Example 9, in addition to the effects described in Example 4, the contact resistance can further be reduced. Because the electric field distribution is changed in the drain side end portion of the gate electrode 2 by adopting the wide recess structure, the further excellent electric field relaxation effect is obtained by combining with the function of the field plate portion 5.

Example 10

Figure 10:
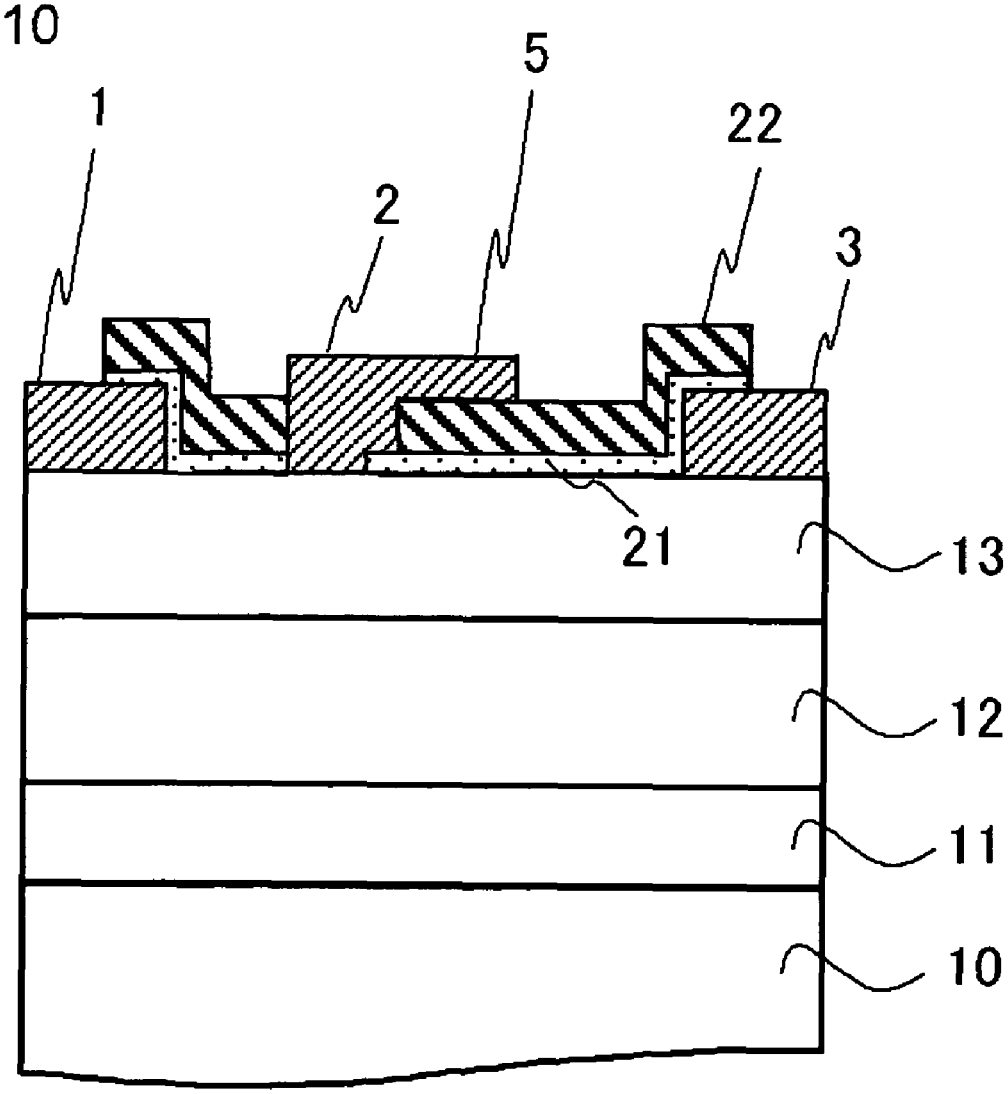
FIG. 10 is a view showing a transistor structure according to an example.

FIG. 10 shows a sectional structure of HJFET according to Example 10. Example 10 has the structure in which the contact layer is added to Example 5. Because the semiconductor layer structure is similar to Example 5, the description will be neglected. According to Example 10, the contact resistance can be reduced when compared with Example 4. Because the electric field distribution is changed in the drain side end portion of the gate electrode 2 by adopting the wide recess structure, the further excellent electric field relaxation effect is obtained by combining with the function of the field plate portion 5.

Example 11

Figure 11:
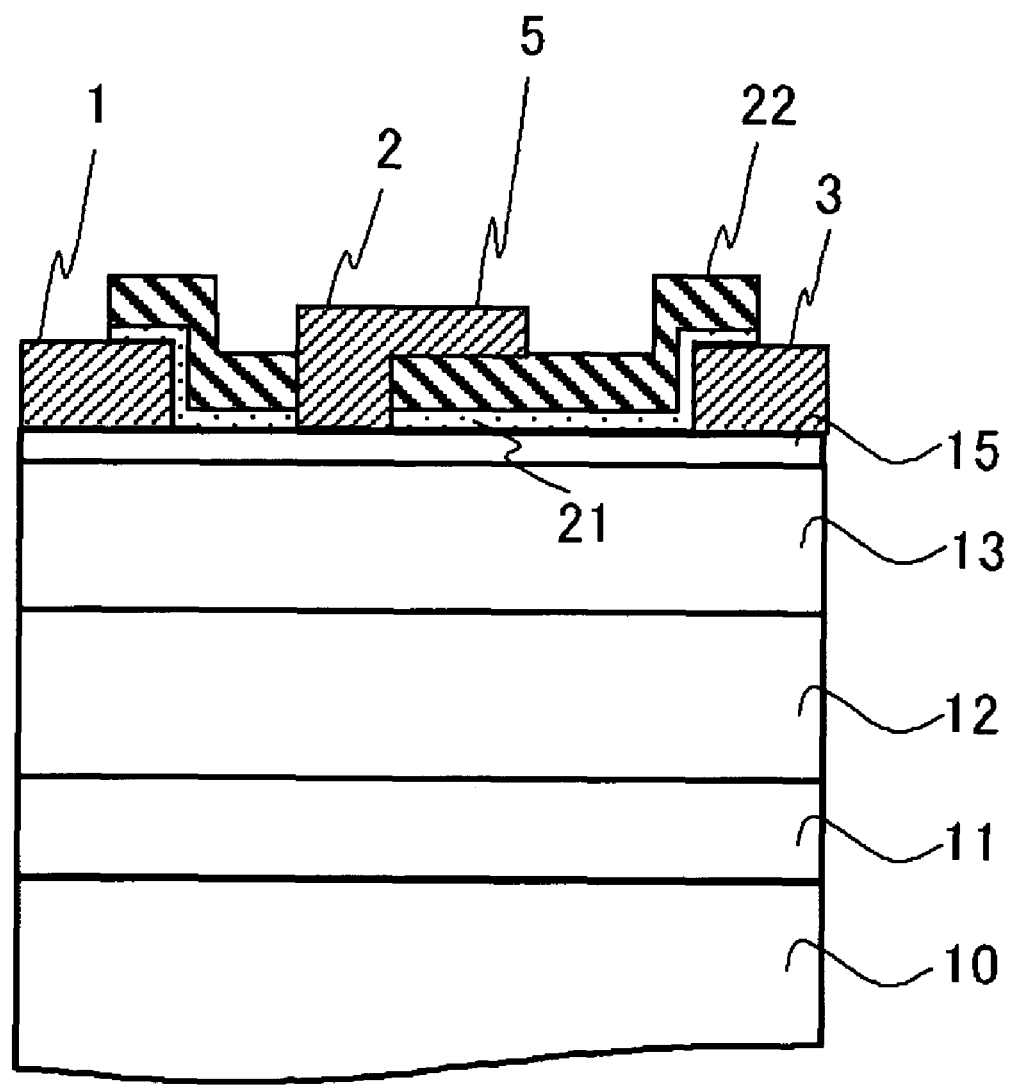
FIG. 11 is a view showing a transistor structure according to an example.

FIG. 11 shows a sectional structure of HJFET according to Example 11. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the GaN channel layer 12, and a GaN cap layer 15 is formed on the AlGaN electron supply layer 13. The source electrode 1 and the drain electrode 3, in which the ohmic contact is secured, are formed on the GaN cap layer. The gate electrode 2, in which the Schottky contact is secured, is provided between the source electrode 1 and the drain electrode 3, and has the field plate portion 5. The surface of the GaN cap layer 15 is covered with the SiN film 21, and the SiO$_2$ film 22 is further provided on the SiN film 21. The SiN film 21 and the SiO$_2$ film 22 are provided immediately below the field plate portion 5.

Example 11 has the structure in which the GaN cap layer is added to the uppermost portion of the semiconductor in Example 1, and Example 11 can realize the higher gate breakdown voltage by increasing the effective Schottky height. Namely, the excellent gate breakdown voltage is obtained by the synergistic action among the field plate portion, the multilayered film immediately below the field plate portion, and the GaN cap layer according to Example 11.

In Example 11, it is preferable that the size of the field plate is not lower than 0.3 µm. It is more preferable that the size of the field plate is not lower than 0.5 µm. It is preferable that the end of the field plate is located at the position where the end of the field plate does not overlap the drain electrode. It is more preferable that the size of the field plate is formed not more than 70% of the distance between the gate electrode and the drain electrode.

Example 12

Figure 12:
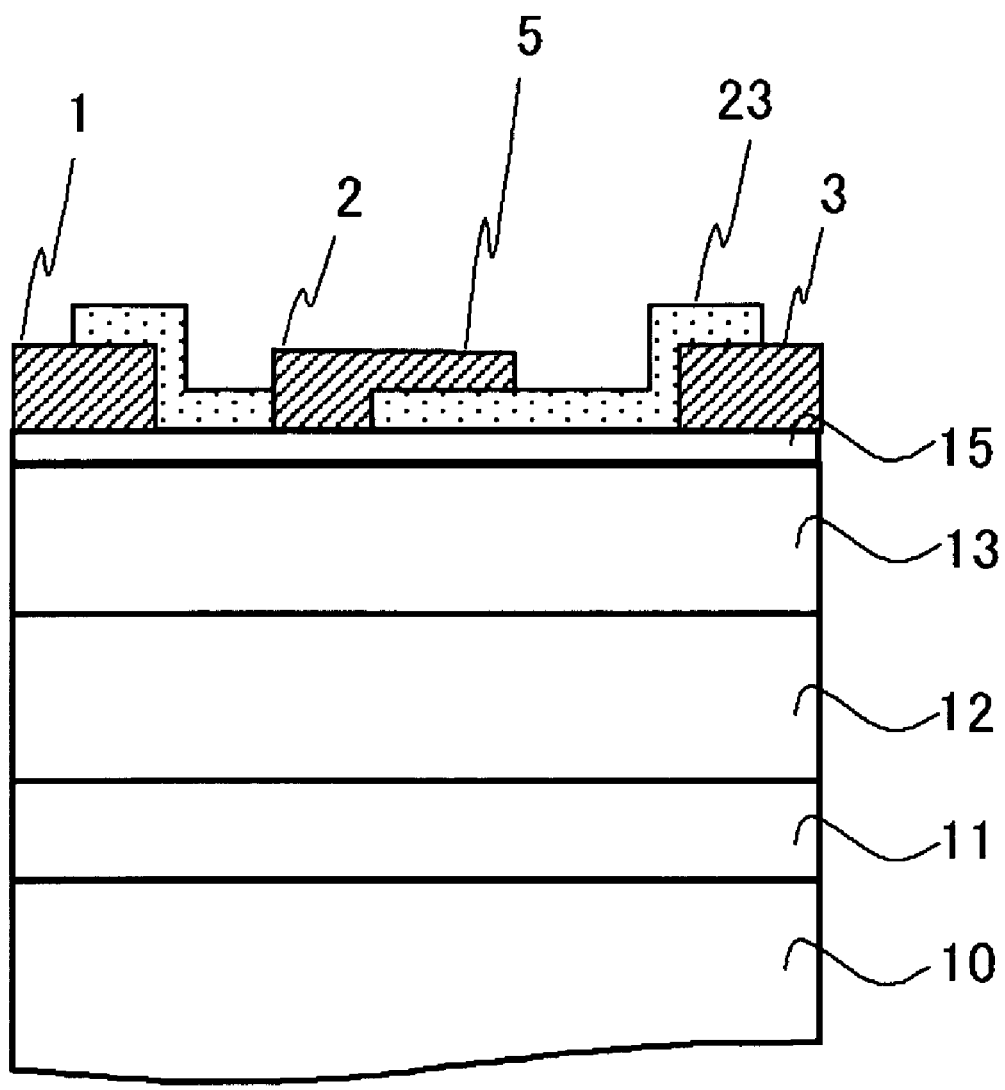
FIG. 12 is a view showing a transistor structure according to an example.

FIG. 12 shows a sectional structure of HJFET according to Example 12. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the GaN channel layer 12, and the GaN cap layer 15 is formed on the AlGaN electron supply layer 13. The source electrode 1 and the drain electrode 3, in which the ohmic contact is secured, are formed on the GaN cap layer. The gate electrode 2, in which the Schottky contact is secured, is provided between the source electrode 1 and the drain electrode 3, and has the field plate portion 5. The surface of the GaN cap layer 15 is covered with the SiON film 23, and the SiON film 23 is provided immediately below the field plate portion 5.

Example 12 has the structure in which the GaN cap layer is added to the uppermost portion of the semiconductor in Example 2, and Example 12 can realize the higher gate breakdown voltage by increasing the effective Schottky height. Namely, the excellent gate breakdown voltage is obtained by the synergistic action among the field plate portion, the multilayered film immediately below the field plate portion, and the GaN cap layer according to Example 12.

In the SiON film of Example 12, it is preferable that the refractive index ranges from 1.6 to 2.0.

In Example 12, it is preferable that the size of the field plate is not lower than 0.3 μm. It is more preferable that the size of the field plate is not lower than 0.5 μm. It is preferable that the end of the field plate is located at the position where the end of the field plate does not overlap the drain electrode. It is more preferable that the size of the field plate is formed not more than 70% of the distance between the gate electrode and the drain electrode.

Example 13

Figure 13:
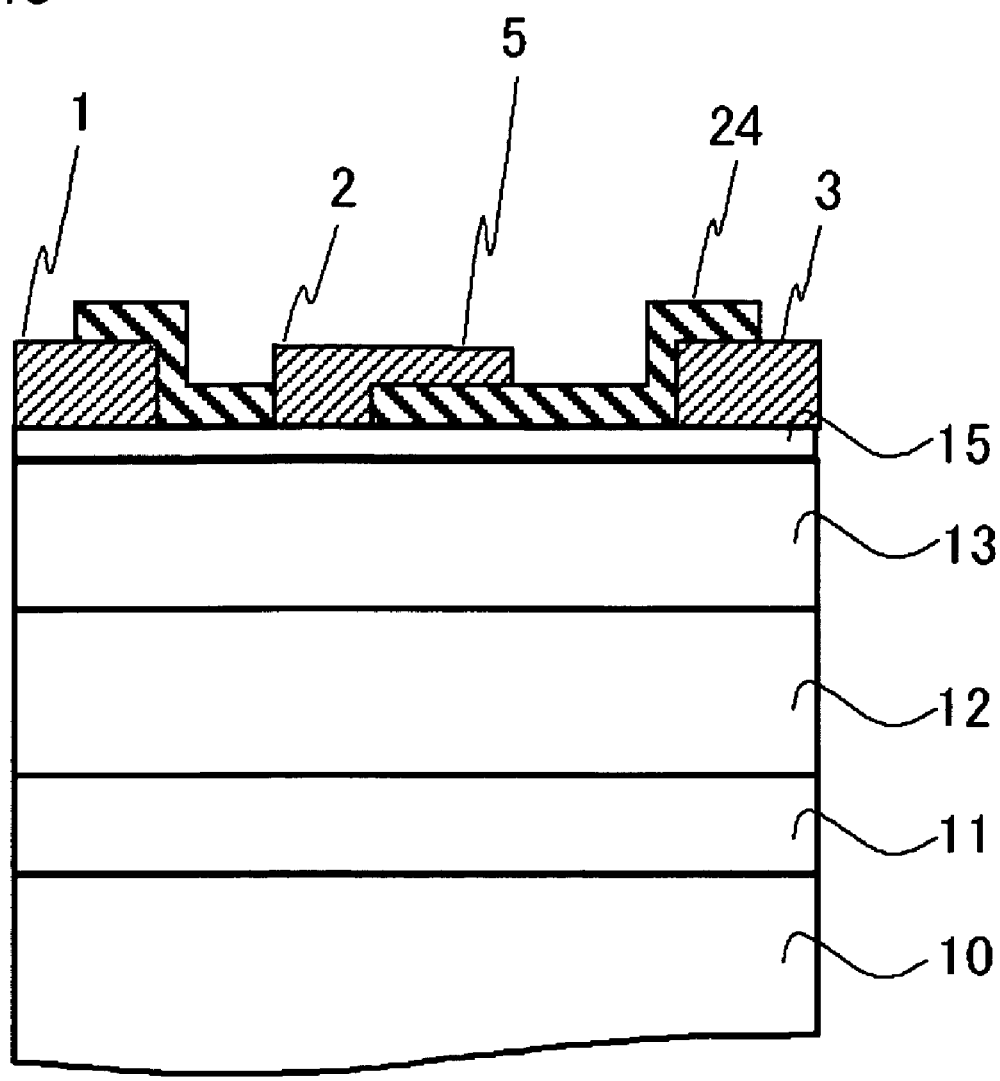
FIG. 13 is a view showing a transistor structure according to an example.

FIG. 13 shows a sectional structure of HJFET according to Example 13. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the GaN channel layer 12, and the GaN cap layer 15 is formed on the AlGaN electron supply layer 13. The source electrode 1 and the drain electrode 3, in which the ohmic contact is secured, are formed on the GaN cap layer. The gate electrode 2, in which the Schottky contact is secured, is provided between the source electrode 1 and the drain electrode 3, and has the field plate portion 5. The surface of the GaN cap layer 15 is covered with the SiOC film 24, and the SiOC film 24 is provided immediately below the field plate portion 5.

Example 13 has the structure in which the GaN cap layer is added to the uppermost portion of the semiconductor in Example 3, and Example 13 can realize the higher gate breakdown voltage by increasing the effective Schottky height. Namely, the excellent gate breakdown voltage is obtained by the synergistic action among the field plate portion, the multilayered film immediately below the field plate portion, and the GaN cap layer according to Example 13.

In Example 13, it is preferable that the size of the field plate is not lower than 0.3 μm. It is more preferable that the size of the field plate is not lower than 0.5 μm. It is preferable that the end of the field plate is located at the position where the end of the field plate does not overlap the drain electrode. It is more preferable that the size of the field plate is formed not more than 70% of the distance between the gate electrode and the drain electrode.

Example 14

Figure 14:
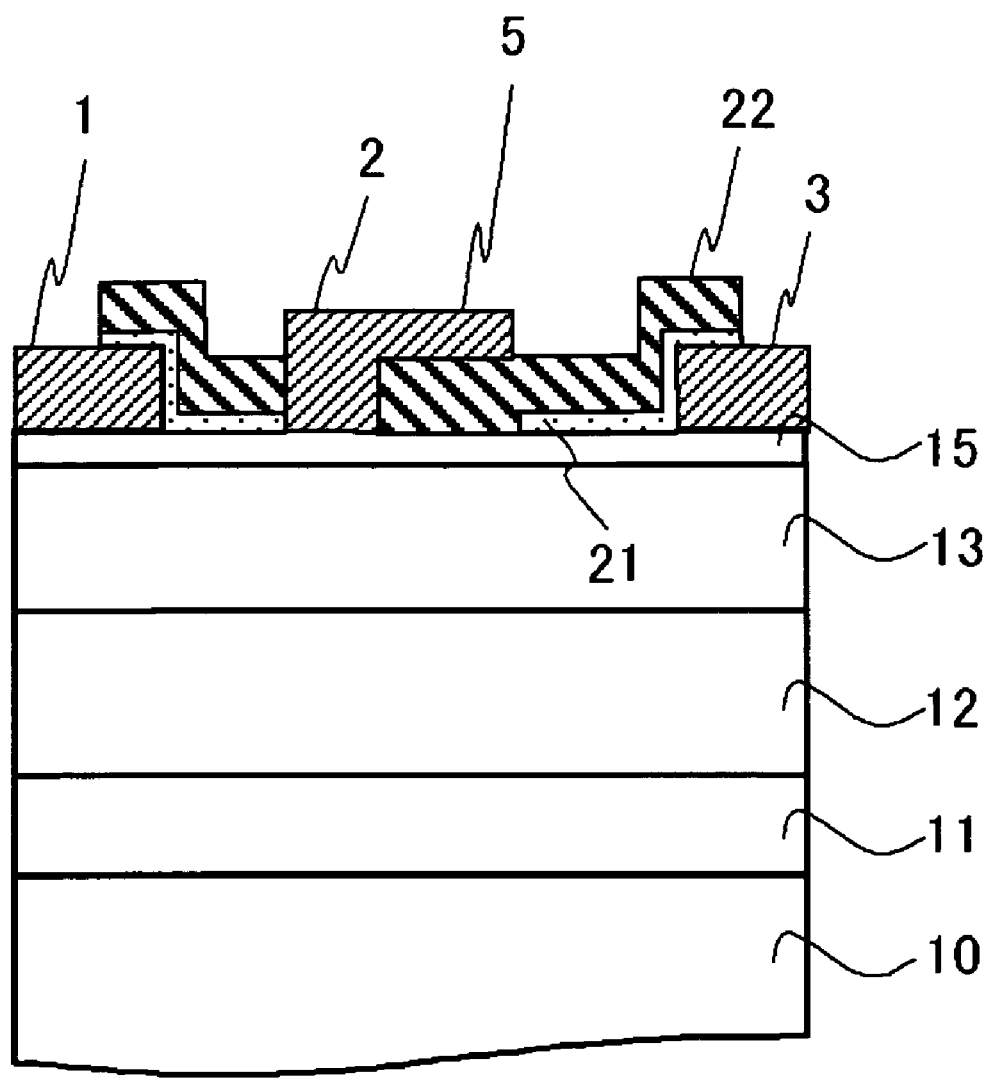
FIG. 14 is a view showing a transistor structure according to an example.

FIG. 14 shows a sectional structure of HJFET according to Example 4. Because the semiconductor layer structure is similar to Example 14, the description will be neglected. Example 14 has the structure in which the GaN cap layer is added to the uppermost portion of the semiconductor in Example 4, and Example 14 can realize the higher gate breakdown voltage by increasing the effective Schottky height. Namely, the excellent gate breakdown voltage is obtained by the synergistic action among the field plate portion, the multilayered film immediately below the field plate portion, and the GaN cap layer according to Example 14.

Example 15

Figure 15:
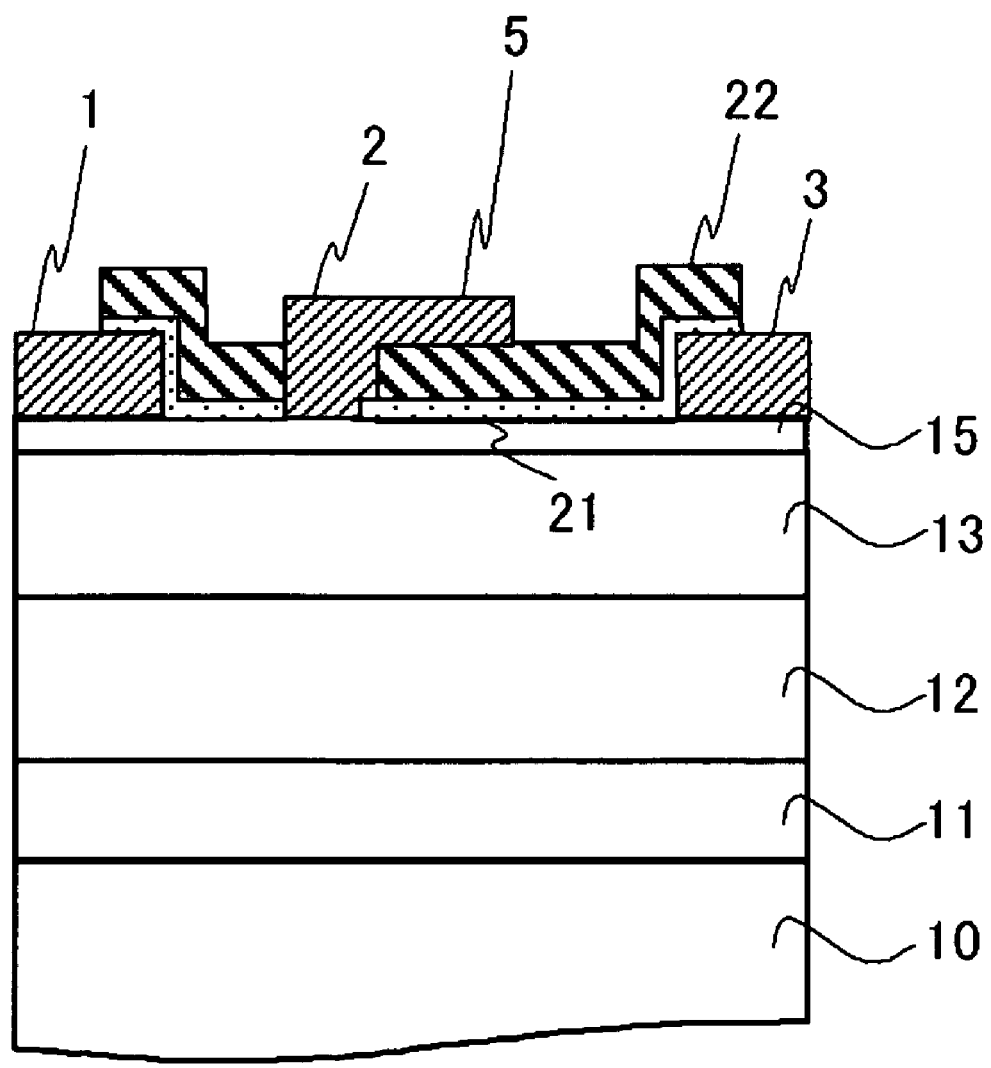
FIG. 15 is a view showing a transistor structure according to an example.

FIG. 15 shows a sectional structure of HJFET according to Example 15. Because the semiconductor layer structure is similar to Example 5, the description will be neglected. Example 15 has the structure in which the GaN cap layer is added to the uppermost portion of the semiconductor in Example 5, and Example 15 can realize the higher gate breakdown voltage by increasing the effective Schottky height. Namely, the excellent gate breakdown voltage is obtained by the synergistic action among the field plate portion, the multilayered film immediately below the field plate portion, and the GaN cap layer according to Example 15.

Example 16

Figure 16:
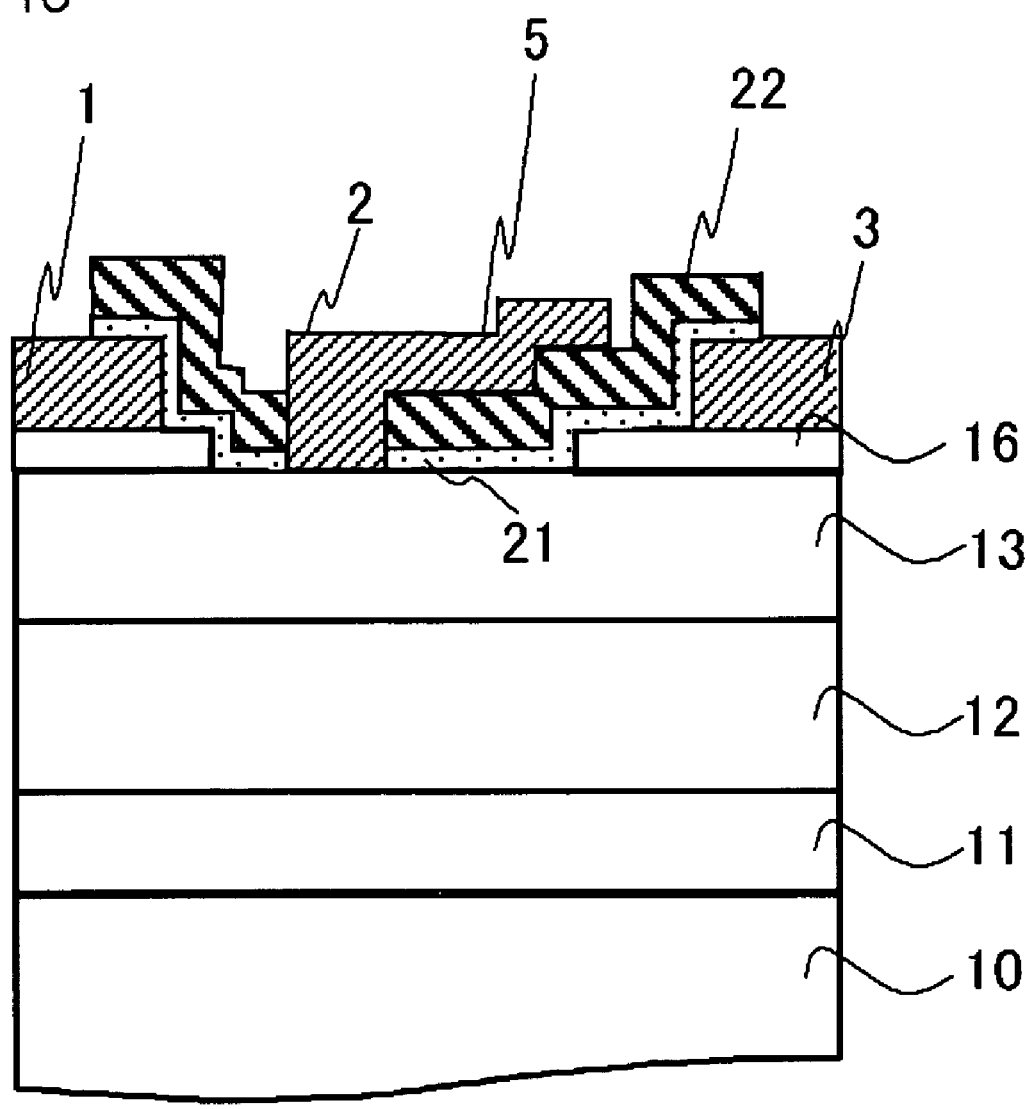
FIG. 16 is a view showing a transistor structure according to an example.

FIG. 16 shows a sectional structure of HJFET according to Example 16. Example 16 has the structure in which the contact layer of Example 6 is made of undoped AlGaN and the field plate overlaps the contact layer.

FIG. 16 shows the sectional structure of HJFET according to Example 16. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the GaN channel layer 12. Undoped AlGaN layers 16 are formed on the AlGaN electron supply layer 13. The source electrode 1 and the drain electrode 3, in which the ohmic contact is secured, are formed while being in contact with the undoped AlGaN layers 16, respectively. The gate electrode 2, in which the Schottky contact is secured, is provided by removing a part of the undoped AlGaN layer between the source electrode 1 and the drain electrode 3. The gate electrode 2 has the field plate portion 5 while being in contact with the exposed AlGaN electron supply layer 13. The element surface is covered with the SiN film 21, and the SiO$_2$ film 22 is further provided on the SiN film 21. The SiN film 21 and the SiO$_2$ film 22 are provided immediately below the field plate portion 5, and the field plate portion 5 overlaps the undoped AlGaN layer 16.

In Example 16, since the contact layer is formed by the undoped AlGaN layer, the electric field concentration is relaxed between the field plate and the contact layer. Therefore, even if the field plate overlaps the contact layer, the gate breakdown voltage is not decreased, which allows the surface charge to be controlled by the field plate over the surface of the AlGaN electron supply layer. As a result, there is generated the effect that the collapse is further effectively suppressed.

In Example 16, since the undoped AlGaN layer 16 is used as the contact layer, the effect that the electric field concentration can be suppressed near the drain electrode is also obtained. In the case where the field plate portion 5 extends toward the drain side, the electric field concentration is relaxed near the gate electrode 2. However, the problem of the electric field concentration near the drain electrode 3 becomes obvious. According to the structure of Example 16, the undoped AlGaN layer 16 is positioned between the drain electrode 3 and the electron supply layer 13, so that the electric field concentration near the drain electrode 3 can effectively be relaxed.

Example 17

Example 17 has the structure in which the contact layer of Example 7 is made of undoped AlGaN and the field plate overlaps the contact layer.

Figure 17:
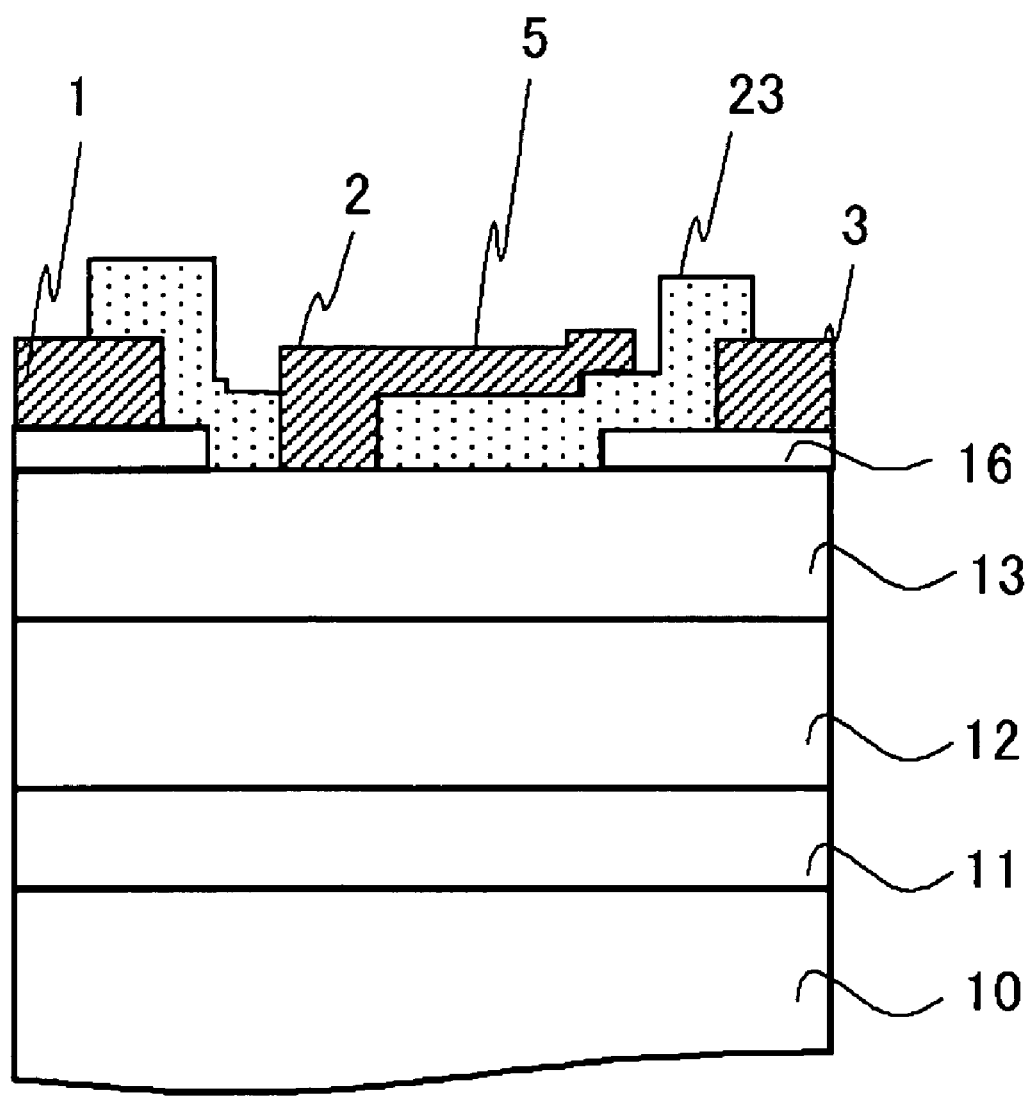
FIG. 17 is a view showing a transistor structure according to an example.

FIG. 17 shows the sectional structure of HJFET according to Example 17. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the GaN channel layer 12. The undoped AlGaN layers 16 are formed on the AlGaN electron supply layer 13. The source electrode 1 and the drain electrode 3, in which the ohmic contact is secured, are formed while being in contact with the undoped AlGaN layers 16, respectively. The gate electrode 2, in which the Schottky contact is secured, is provided by removing a part of the undoped AlGaN layer between the source electrode 1 and the drain electrode 3. The gate electrode 2 has the field plate portion 5 while being in contact with the exposed AlGaN electron supply layer 13. The element surface is covered with the SiON film 23, the SiON film 23 is provided immediately below the field plate portion 5, and the field plate portion 5 overlaps the undoped AlGaN layer 16.

In Example 17, since the contact layer is formed by the undoped AlGaN layer, the electric field concentration is relaxed between the field plate and the contact layer. Therefore, even if the field plate overlaps the contact layer, the gate breakdown voltage is not decreased, which allows the surface charge to be controlled by the field plate over the surface of the AlGaN electron supply layer. As a result, there is generated the effect that the collapse is further effectively suppressed.

In Example 17, since the undoped AlGaN layer 16 is used as the contact layer, the effect that the electric field concentration can be suppressed near the drain electrode is also obtained. In the case where the field plate portion 5 extends toward the drain side, the electric field concentration is relaxed near the gate electrode 2. However, the problem of the electric field concentration near the drain electrode 3 becomes obvious. According to the structure of Example 17, the undoped AlGaN layer 16 is positioned between the drain electrode 3 and the electron supply layer 13, so that the electric field concentration near the drain electrode 3 can effectively be relaxed.

Example 18 to Example 20

Figure 18:
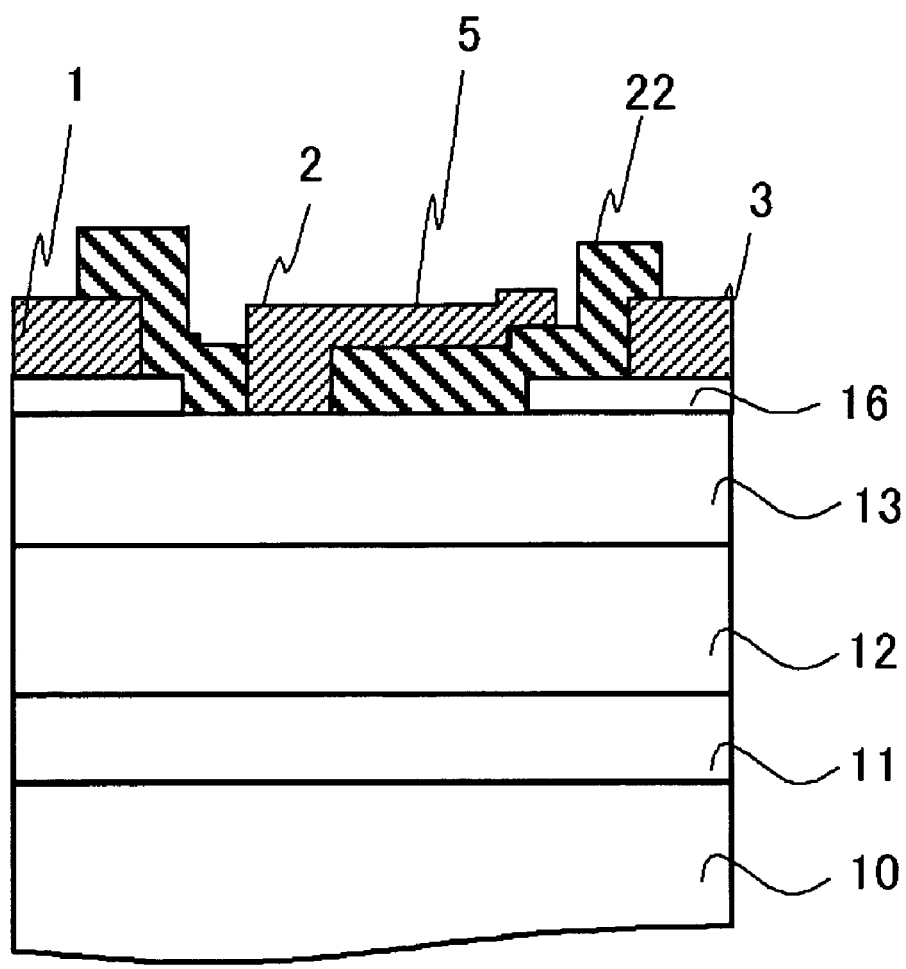
FIG. 18 is a view showing a transistor structure according to an example.
Figure 19:
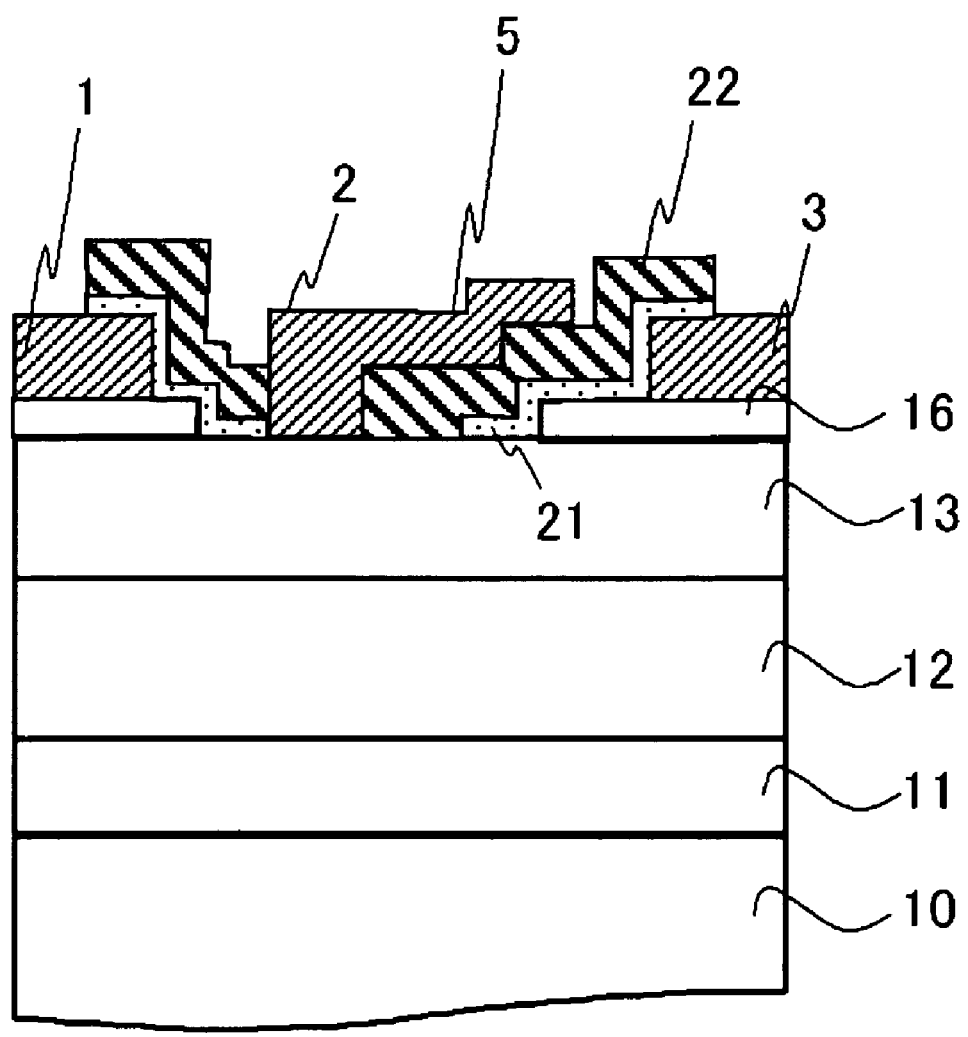
FIG. 19 is a view showing a transistor structure according to an example.
Figure 20:
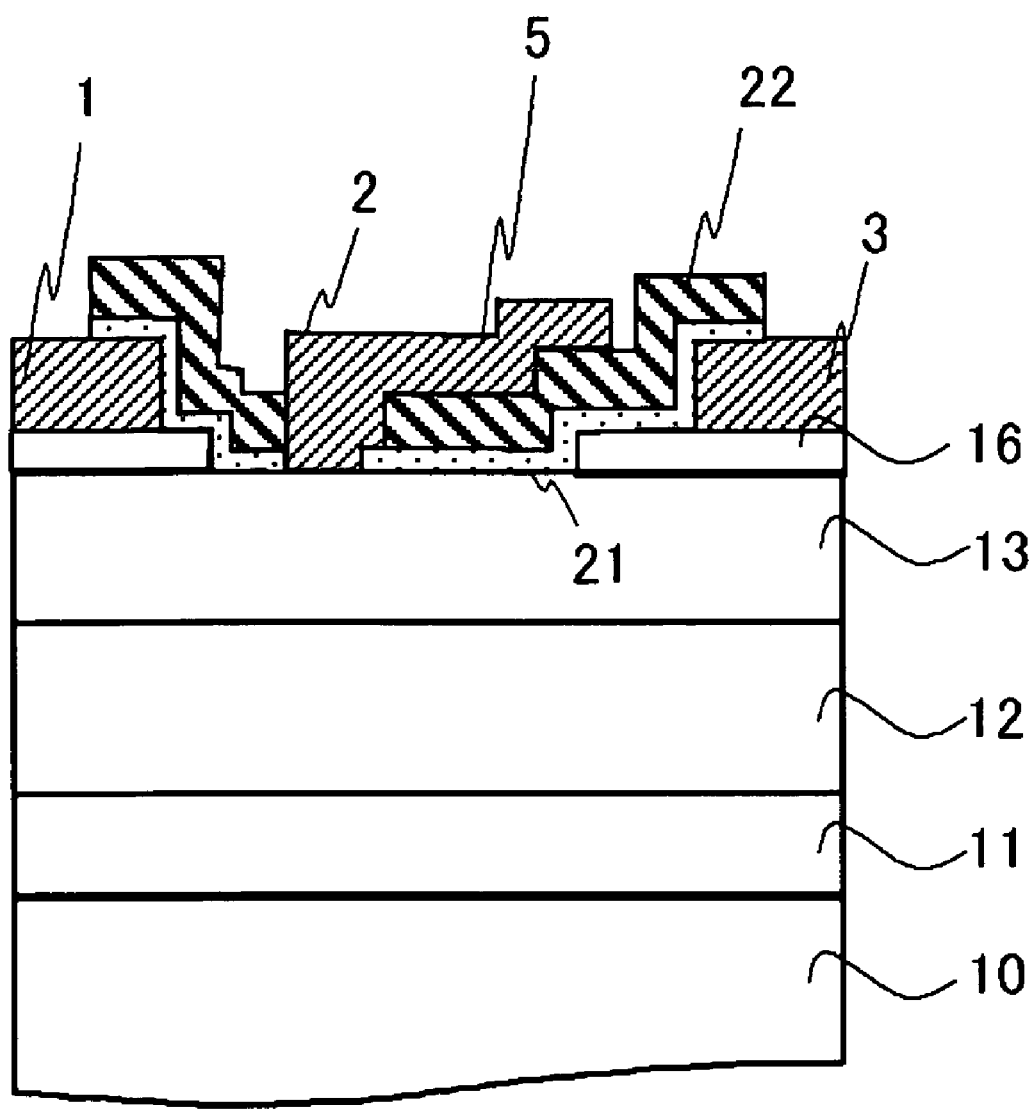
FIG. 20 is a view showing a transistor structure according to an example.
Figure 21:
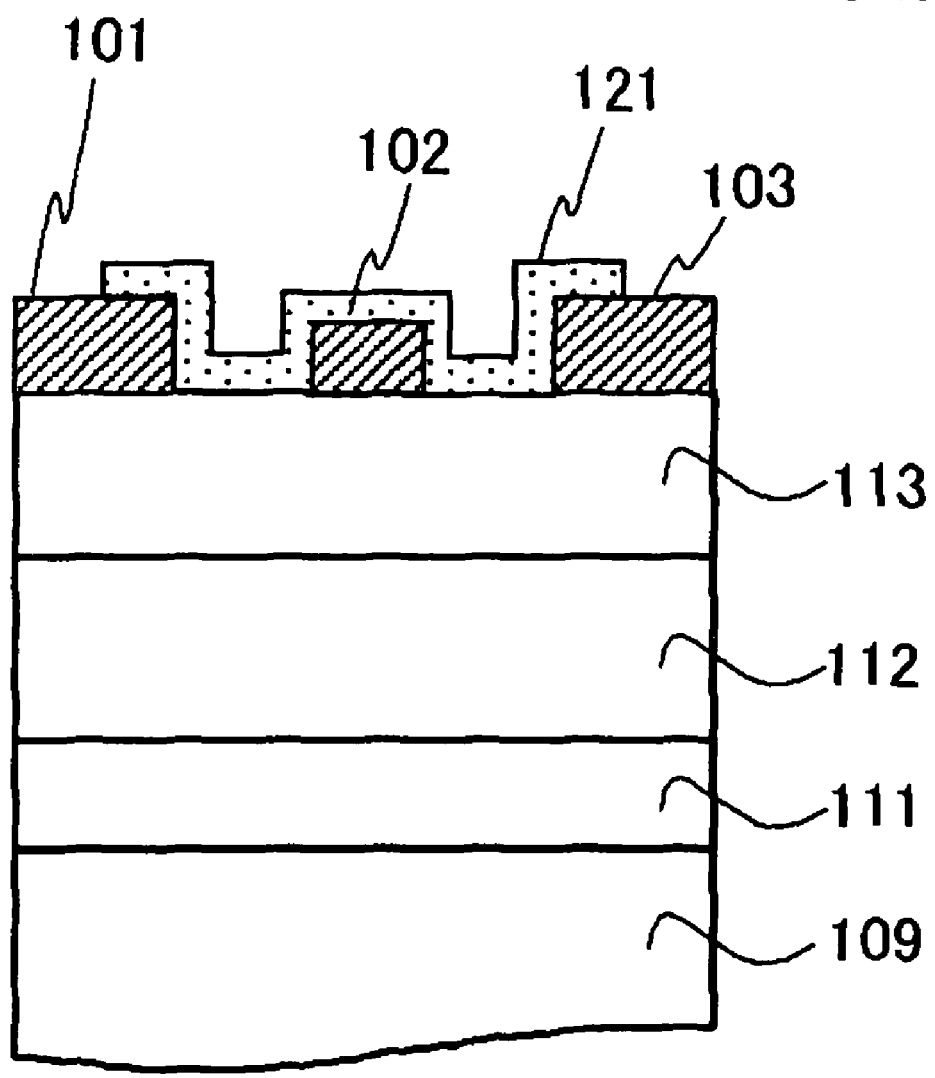
FIG. 21 is a view showing a GaN FET structure.
Figure 22:
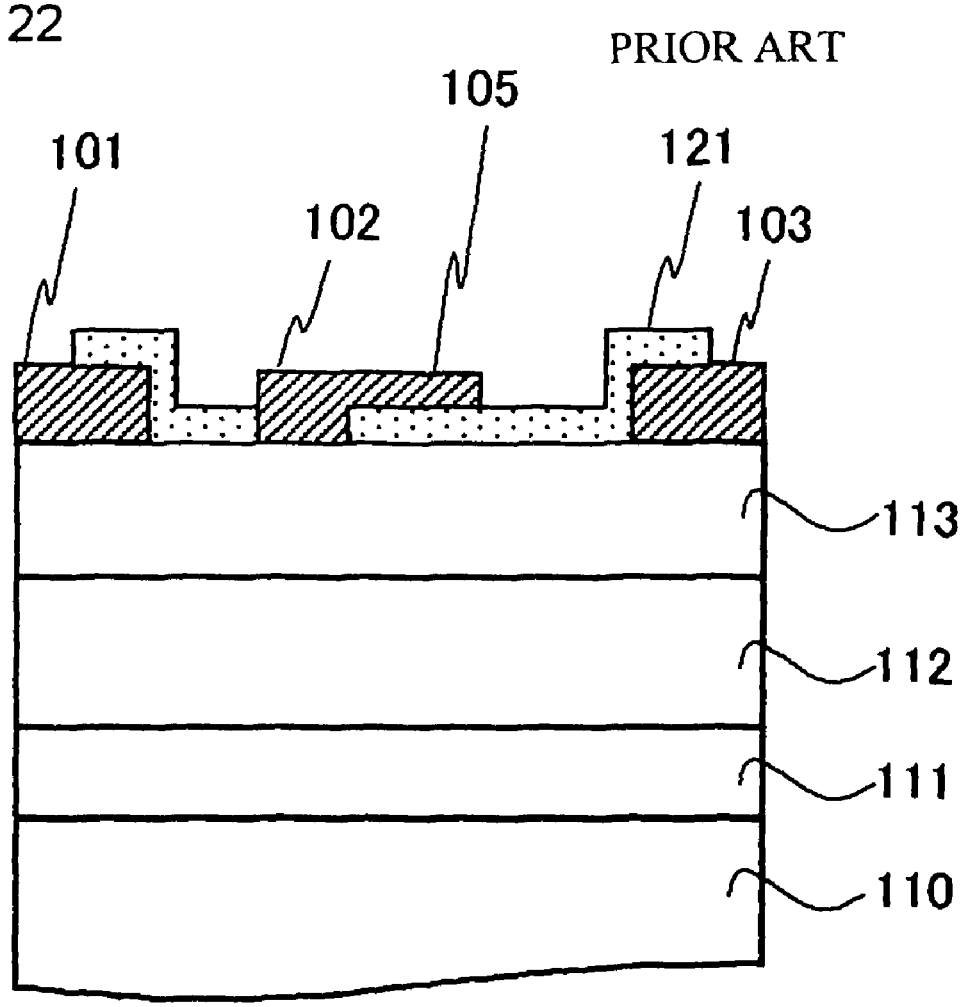
FIG. 22 is a view showing a GaN FET structure.
Figure 23:
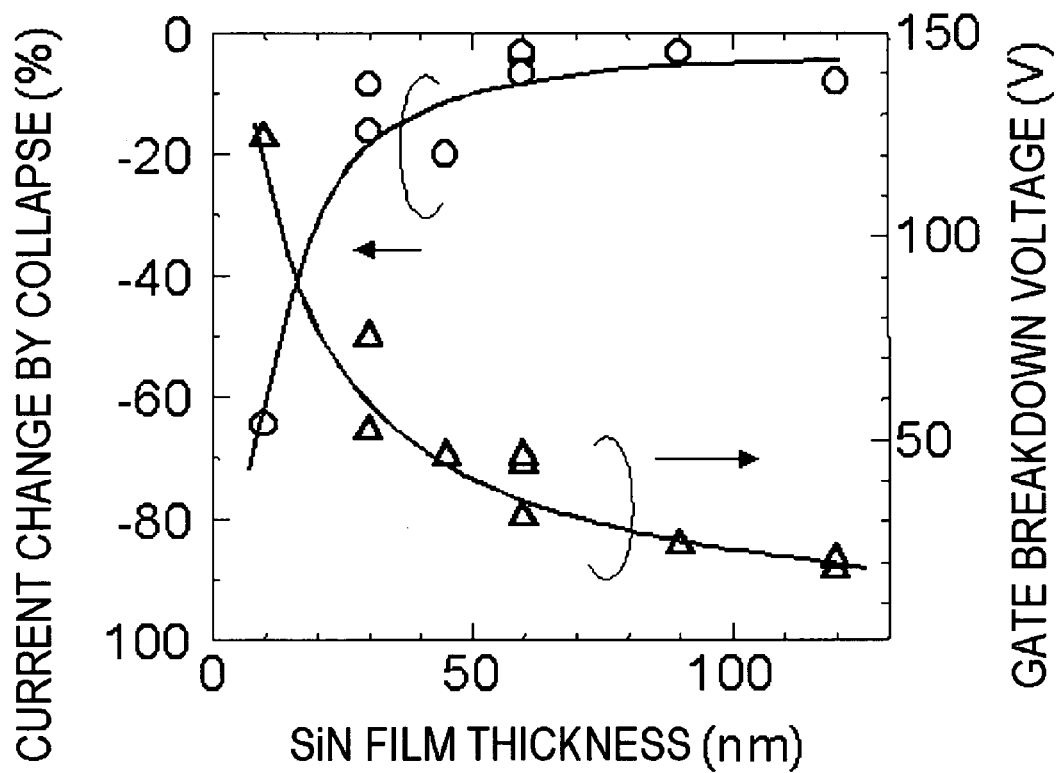
FIG. 23 is a view for explaining a trade-off between gate breakdown voltage and collapse.

Examples 18 to 20 have the structures in which the contact layer in Examples 8 to 10 is made of undoped AlGaN and the field plate overlaps the contact layer (FIGS. 18 to 20).

In Examples 18 to 20, since the contact layer is made of the undoped AlGaN layer, the electric field concentration is relaxed between the field plate and the contact layer. Therefore, even if the field plate overlaps the contact layer, the gate breakdown voltage is not decreased, which allows the surface charge to be controlled by the field plate over the surface of the AlGaN electron supply layer. As a result, there is generated the effect that the collapse is further effectively suppressed.

In Examples 18 to 20, since the undoped AlGaN layer 16 is used as the contact layer, the effect that the electric field concentration can be suppressed near the drain electrode is also obtained. In the case where the field plate portion 5 extends toward the drain side, the electric field concentration is relaxed near the gate electrode 2. However, the problem of the electric field concentration near the drain electrode 3 becomes obvious. According to the structures of Examples 18 to 20, the undoped AlGaN layer 16 is positioned between the drain electrode 3 and the electron supply layer 13, so that the electric field concentration near the drain electrode 3 can effectively be relaxed.

In Examples 18 to 20, the amount of aluminum content is arbitrarily determined in the undoped AlGaN layers 16 and the AlGaN electron supply layer 13. When the undoped AlGaN layers 16 and the AlGaN electron supply layer 13 have the same aluminum content, because the undoped AlGaN layers 16 and the AlGaN electron supply layer 13 are made of the same material, the low resistance is obtained. When the undoped AlGaN layers 16 are higher than the AlGaN electron supply layer 13 located beneath the undoped AlGaN layers 16 in the aluminum content, the carrier is generated in the interlayer between the undoped AlGaN layers 16 and the AlGaN electron supply layer 13 by the piezo effect, which allows the low resistance to be realized.

Example 21 and Example 22

Figure 26:
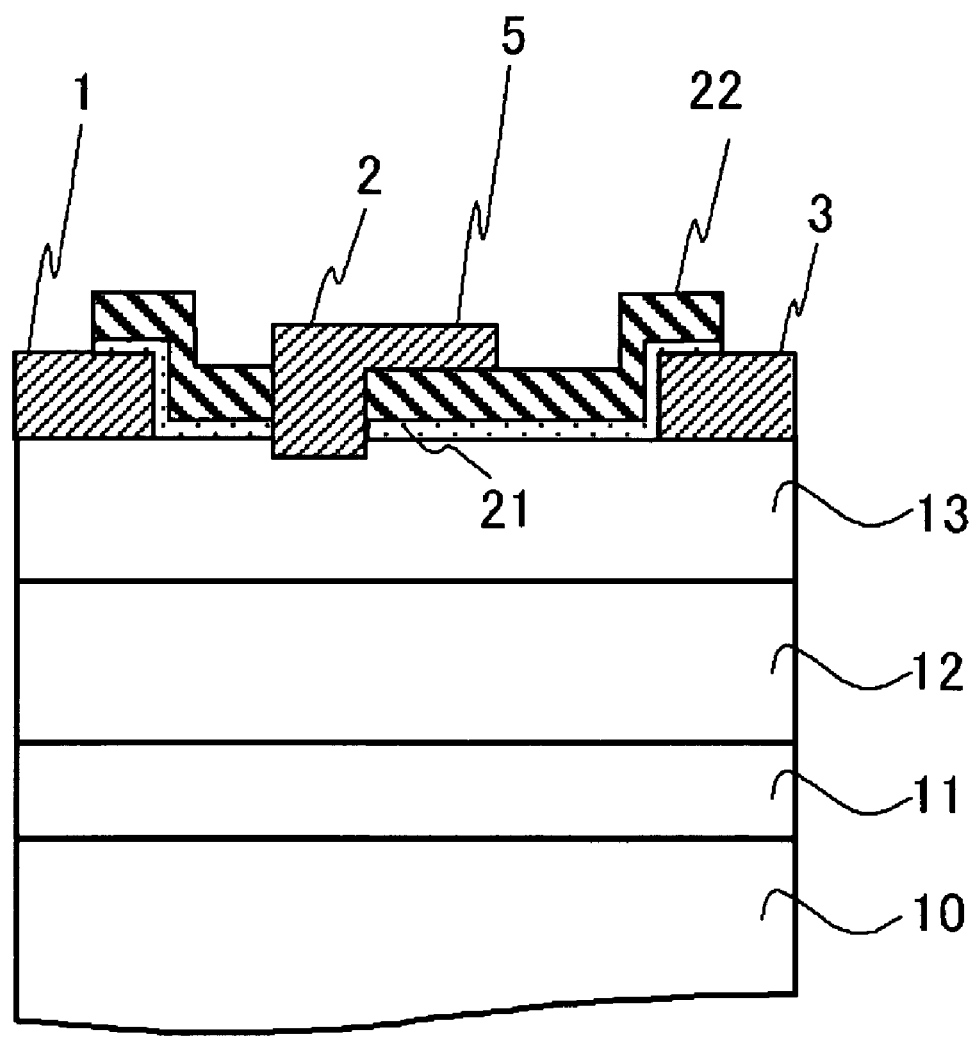
FIG. 26 is a view showing a transistor structure according to an example.
Figure 27:
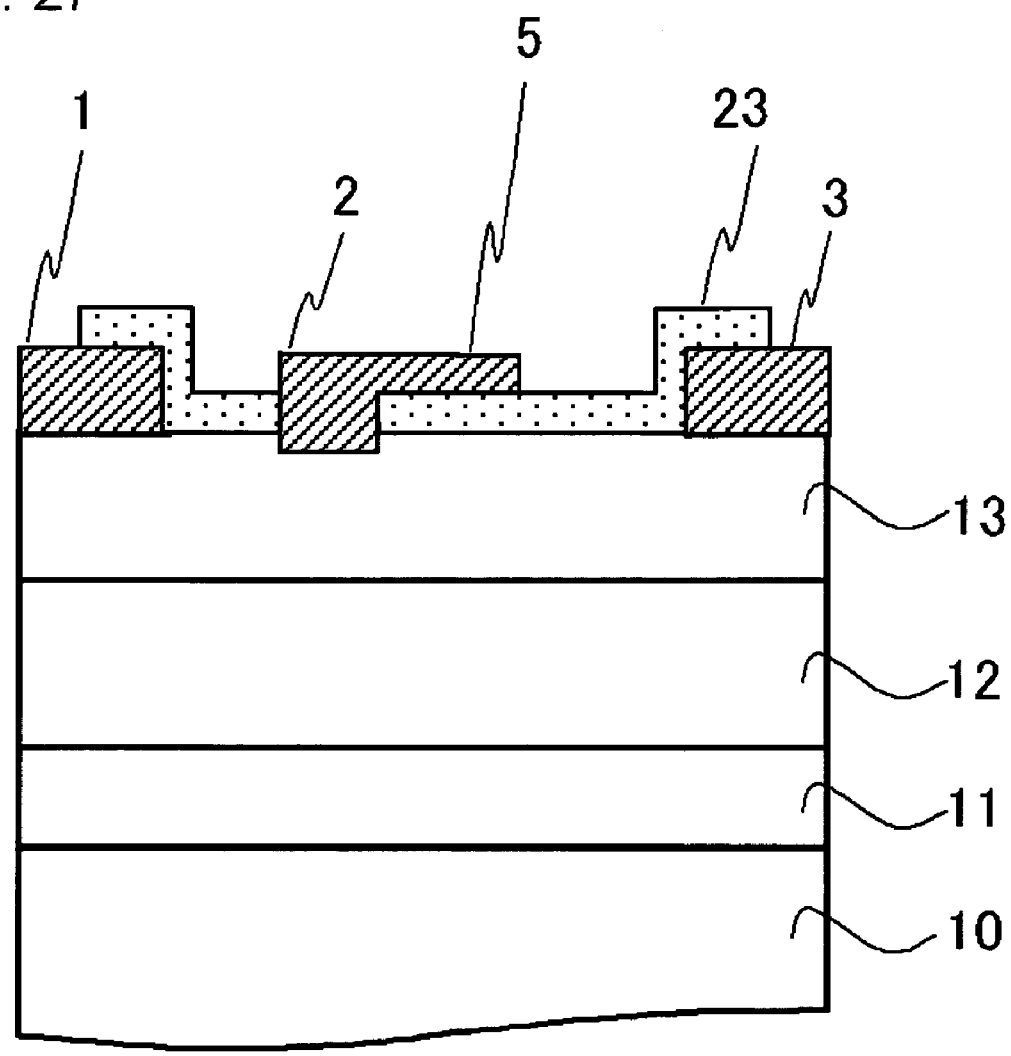
FIG. 27 is a view showing a transistor structure according to an example.

FIGS. 26 and 27 show the transistors according to Examples 21 and 22. Examples 21 and 22 have the so-called gate recess structure in which a part of the lower portion of the gate electrode 2 is embedded in the AlGaN electron supply layer 13 in Examples 1 and 2. Therefore, the excellent gate breakdown voltage is obtained by combining with the action of the field plate portion.

Example 23

Figure 37:
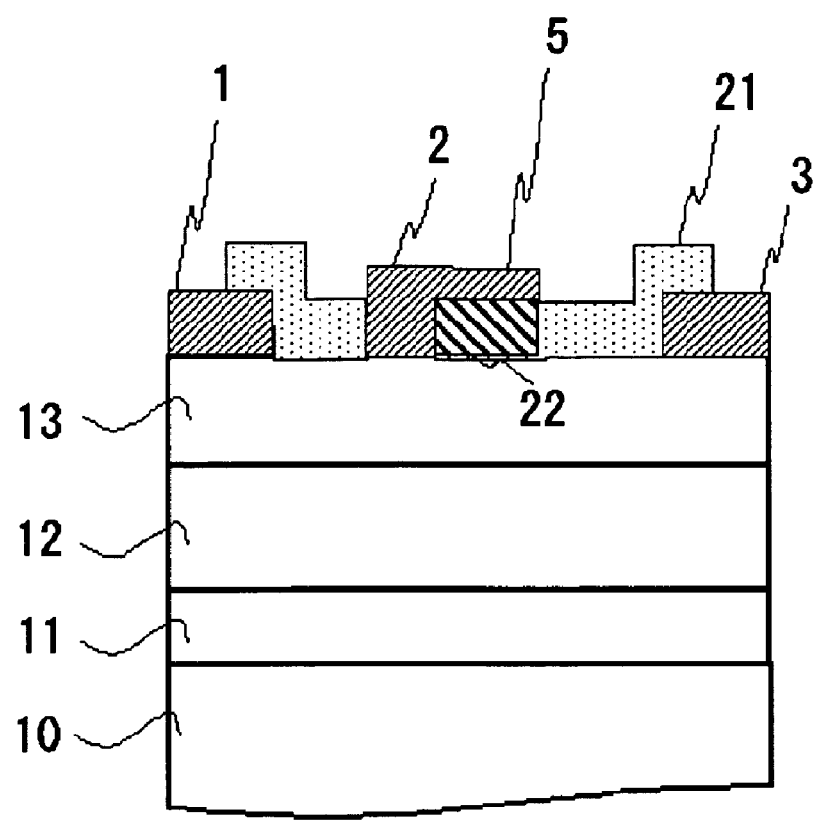
FIG. 37 is a view explaining a transistor structure according to an example.
Figure 38:
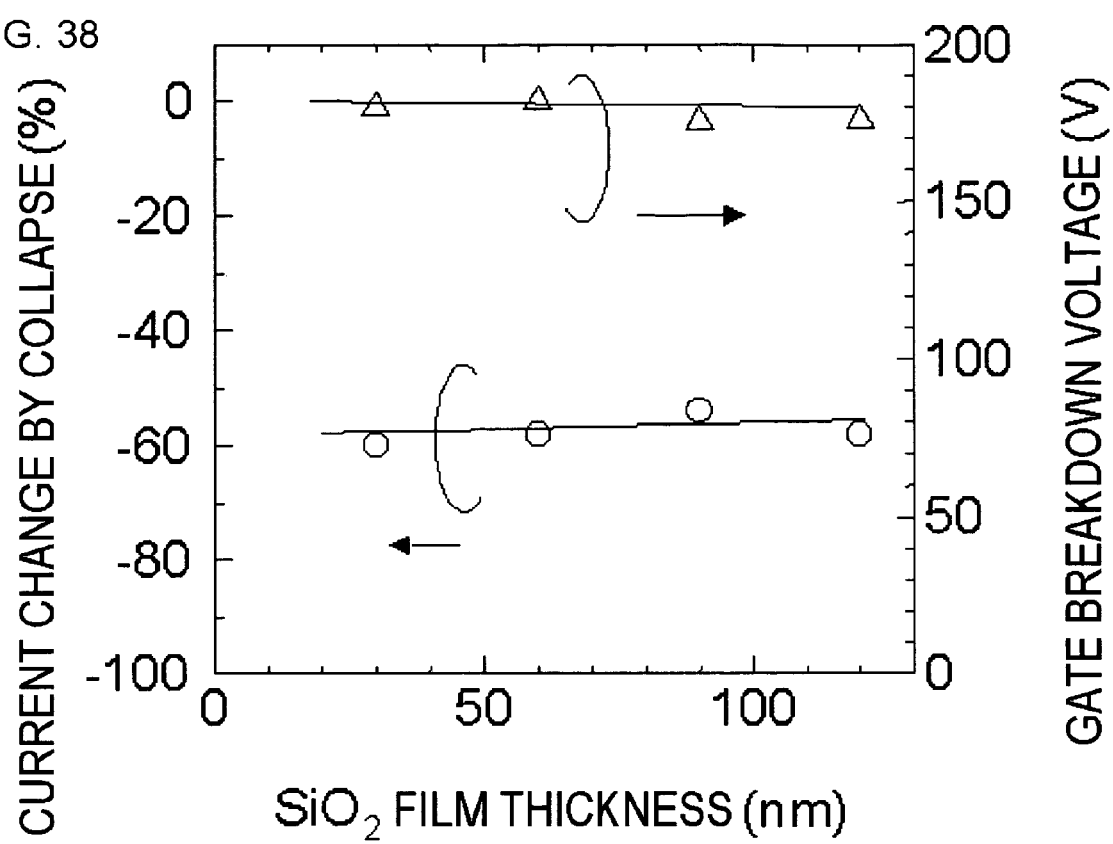
FIG. 38 is a view for explaining a relationship between gate breakdown voltage and collapse when a silicon oxide layer is used.

FIG. 37 shows the sectional structure of HJFET according to Example 23. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the GaN channel layer 12. The source electrode 1 and the drain electrode 3, in which the ohmic contact is secured, are formed on the electron supply layer. The gate electrode 2, in which the Schottky contact is secured, is provided between the source electrode 1 and the drain electrode 3. The gate electrode 2 has the field plate portion 5 overhanging the drain side in the visored shape.

In Example 23, because the area immediately below the field plate portion is formed by the $SiO_2$ film 22, the capacity in the area can be decreased, the gain can be improved, and the reliability is also improved. Further, because the SiN film 21 is formed on the surface of the AlGaN electron supply layer 13 in the area except for the area where the $SiO_2$ film 22 is formed, the collapse can be improved to a certain level.

In Example 23, instead of the SiN film 21, it is also possible that the SiON film is provided. Therefore, the reliability and the gain can further be improved.

Example 24

Figure 39:
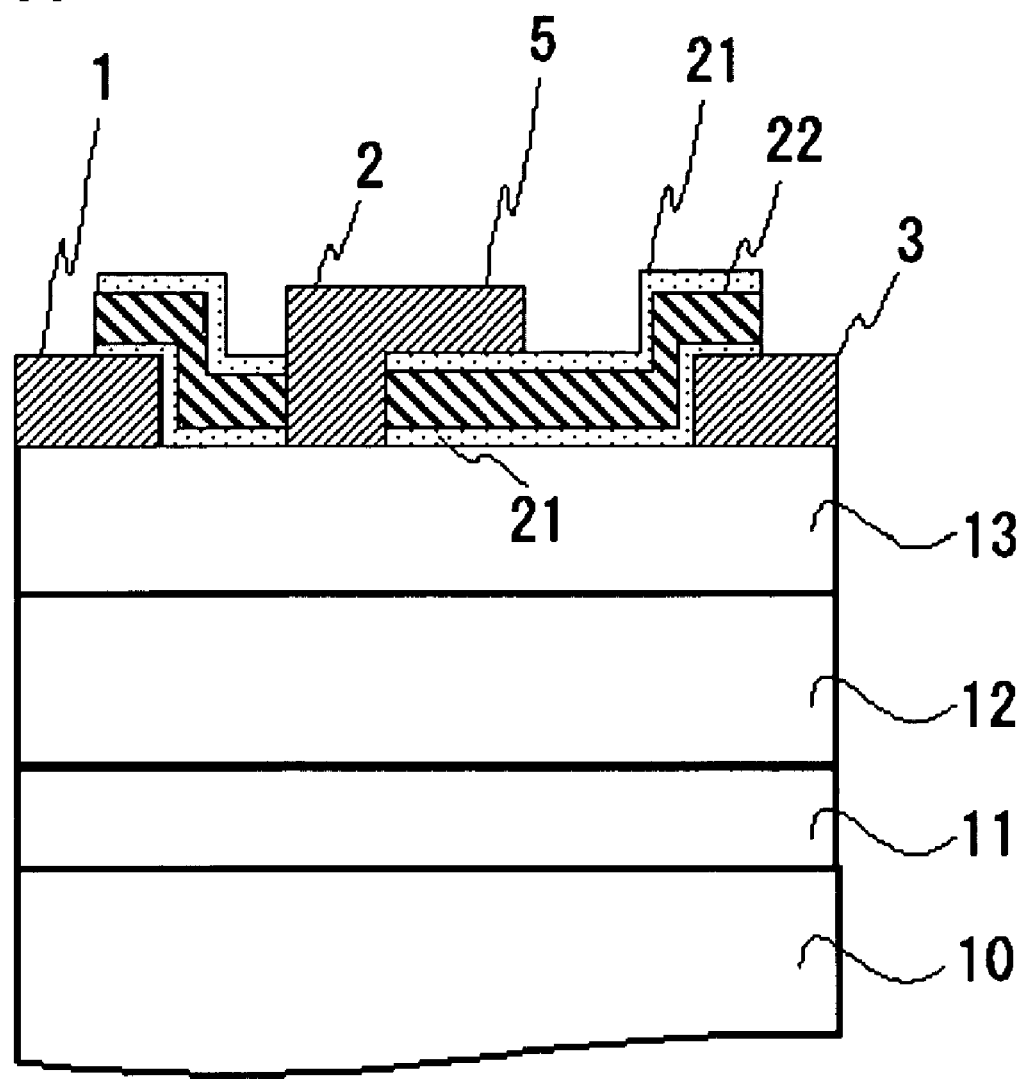
FIG. 39 is a view explaining a transistor structure according to an example.

FIG. 39 shows the sectional structure of HJFET according to Example 24. In Example 24, the insulating film formed on the AlGaN electron supply layer 13 has three-layer structure in which the SiN film 21, the SiO$_2$ film 22, and the SiN film 21 are sequentially laminated. The semiconductor layer structure below the gate electrode is similar to the above-described Examples. The uppermost layer of the insulating film is formed not by the SiO$_2$ film 22, but by the SiN film 23. Therefore, the resist is easily stably formed in the element manufacturing process, and the yield is improved.

Thus, the invention has been described based on Examples. Examples are illustrative only, and it should be understood for the skilled in the art that various modifications can be made in combination of each constituent element and each process, and such modifications are within the scope of the invention.

For example, in the above-described Examples, SiC is used as the substrate material. However, it is also possible that a substrate using other kind of materials such as sapphire and the Group III semiconductor substrate such as GaN and AlGaN are used as the substrate material.

The semiconductor layer structure below the gate is not limited to the illustrations, but the various modes can be adopted. For example, it is possible to form the structure in which the AlGaN electron supply layers 13 are provided in not only the upper portion of the GaN channel layer 12 but also the lower portion of the GaN channel layer 12.

The low-dielectric-constant film is not limited to those illustrated in Examples, but various materials can be used as the low-dielectric-constant film. Further, in FIGS. 1 to 21 shown with the above-described Examples, the insulating film is provided over all the areas between the source electrode and the gate electrode and between the drain electrode and the gate electrode. However, in order to achieve the effect of the invention, it is sufficient that the insulating film is provided in a predetermined area between the drain electrode and the gate electrode, and it is not always necessary to provide the insulating film between the source electrode and the gate electrode. Further, in the insulating film provided between the drain electrode and the gate electrode, it is not always necessary that the insulating film is provided over all the areas between the source electrode and the gate electrode. For example, it is possible that the insulating film is provided only in the lower portion of the field plate portion.

What is claimed is:

1. A field-effect transistor comprising a Group III nitride semiconductor layer structure including a heterojunction formed by a channel layer made of In$_x$Ga$_{1-x}$N ($0 \leq x \leq 1$) and an electron supply layer made of Al$_y$Ga$_{1-y}$N ($0 < y \leq 1$), a source electrode and a drain electrode formed on the semiconductor layer structure while being separated from each other, a gate electrode arranged between said source electrode and said drain electrode, and an insulating film formed on said Group III nitride semiconductor layer, wherein said gate electrode has a field plate portion formed on said insulating film while said field plate portion has a visored shape that overhangs a gate side of said insulating film between said gate electrode and said drain electrode, and said insulating film has a multilayered film including a first insulating film and a second insulating film, said first insulating film being made of a compound that includes silicon and nitrogen as constituent elements, said second insulating film having a dielectric constant lower than that of said first insulating film, wherein said second insulating film is laminated on said first insulating film, and wherein said insulating film is formed having a double-stepped structure with first, second and third parallel regions in which the first parallel region is in contact with and disposed below the second parallel region, and in which the second parallel region is in contact with and disposed below the third parallel region.

2. A field-effect transistor according to claim 1, wherein the thickness of said first insulating film is not more than 150 nm.

3. A field-effect transistor according to claim 1, wherein a dielectric constant of said second insulating film is not more than 3.5.

4. A field-effect transistor according to claim 1, wherein said insulating film including said multilayered film is formed while being separated from said gate electrode, and said second insulating film is provided between said first insulating film and said gate electrode.

5. A field-effect transistor according to claim 4, wherein said second insulating film is provided between said first insulating film and said gate electrode and said second insulating film is positioned below said field plate portion, and said multilayered film including said first insulating film and said second insulating film is positioned between a drain-side end portion of said field plate portion and said drain electrode.

6. A field-effect transistor according to claim 1, further comprising a third insulating film on said second insulating film, the third insulating film being made of a compound that includes silicon and nitrogen as the constituent elements.

7. A field-effect transistor according to claim 1, wherein contact layers are arranged between said source electrode and a surface of said semiconductor layer structure and between said drain electrode and a surface of said semiconductor layer structure, respectively.

8. A field-effect transistor according to claim 7, wherein said contact layer is formed by an undoped AlGaN layer.

9. A field-effect transistor according to claim 8, wherein said field plate portion extends to an upper portion of said contact layer.

10. A field-effect transistor according to claim 1, wherein said semiconductor layer structure has a structure in which the channel layer made of InxGa1-xN ($0 \leq x \leq 1$), the electron supply layer made of AlyGa1-yN ($0 < y \leq 1$), and a cap layer made of GaN are sequentially laminate.

11. A field-effect transistor according to claim 1, wherein said field plate portion having a visored shape does not overhang any part of said insulating film between said gate electrode and said source electrode.

12. A field-effect transistor comprising a Group III nitride semiconductor layer structure including a heterojunction formed by a channel layer made of In$_x$Ga$_{1-x}$N ($0 \leq x \leq 1$) and an electron supply layer made of Al$_y$Ga$_{1-y}$N ($0 < y \leq 1$), a source electrode and a drain electrode formed on the semiconductor layer structure while being separated from each other, a gate electrode arranged between said source electrode and said drain electrode, and an insulating film formed on said Group III nitride semiconductor layer, wherein said gate electrode has a field plate portion formed on said insulating film while said field plate portion has a visored shape that overhangs a gate side of said insulating film between said gate electrode and said drain electrode, and said drain electrode side is lower than said gate electrode side in a dielectric constant of a capacity formed by said field plate portion, said Group III nitride semiconductor layer, and said insulating film sandwiched therebetween, wherein a part of said insulating film is a multilayered film including a first insulating film and a second insulating film, said first insulating film being made of a compound that includes silicon and nitrogen as constituent elements, said second insulating film having a dielectric constant lower than that of said first insulating film, and said gate electrode side is formed by a single-layer film of the first insulating film and said drain electrode side is formed by the multilayered film including said first insulating film and said second insulating film in said insulating film between said field plate portion and a surface of said semiconductor layer structure.

* * * * *